(12) United States Patent
Yoshikawa et al.

(10) Patent No.: US 7,989,124 B2
(45) Date of Patent: Aug. 2, 2011

(54) PHOTOMASK BLANK AND PHOTOMASK MAKING METHOD

(75) Inventors: Hiroki Yoshikawa, Joetsu (JP); Yukio Inazuki, Joetsu (JP); Satoshi Okazaki, Joetsu (JP); Takashi Haraguchi, Tokyo (JP); Tadashi Saga, Tokyo (JP); Yosuke Kojima, Tokyo (JP); Kazuaki Chiba, Tokyo (JP); Yuichi Fukushima, Tokyo (JP)

(73) Assignees: Toppan Printing Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/820,908

(22) Filed: Jun. 22, 2010

(65) Prior Publication Data

US 2010/0261099 A1 Oct. 14, 2010

Related U.S. Application Data

(62) Division of application No. 11/715,368, filed on Mar. 8, 2007, now Pat. No. 7,767,367.

(30) Foreign Application Priority Data

Mar. 10, 2006 (JP) ................. 2006-065763

(51) Int. Cl.
*G03F 1/00* (2006.01)

(52) U.S. Cl. ............................. 430/5; 430/311; 430/394

(58) Field of Classification Search ............... 430/5, 311, 430/394
See application file for complete search history.

(56) References Cited

U.S. PATENT DOCUMENTS

| | | | |
|---|---|---|---|
| 4,707,218 A | 11/1987 | Giammarco et al. | |
| 5,474,864 A | 12/1995 | Isao et al. | |
| 5,482,799 A | 1/1996 | Isao et al. | |
| 5,523,185 A | 6/1996 | Goto | |
| 5,592,317 A | 1/1997 | Fujikawa et al. | |
| 6,037,083 A | 3/2000 | Mitsui | |
| 6,335,124 B1 | 1/2002 | Mitsui et al. | |
| 6,395,433 B1 | 5/2002 | Smith | |
| 6,472,107 B1 | 10/2002 | Chan | |
| 6,599,667 B2 | 7/2003 | Yusa et al. | |
| 2001/0006754 A1 | 7/2001 | Okazaki et al. | |
| 2002/0058186 A1 | 5/2002 | Nozawa et al. | |
| 2002/0115003 A1 | 8/2002 | Tsukamoto et al. | |

(Continued)

FOREIGN PATENT DOCUMENTS

EP 1 152 292 A2 11/2001

(Continued)

OTHER PUBLICATIONS

European Search Report issued on Dec. 4, 2009 in European Patent Application No. 07 25 1604.

(Continued)

*Primary Examiner* — Mark F Huff
*Assistant Examiner* — Rashid Alam
(74) *Attorney, Agent, or Firm* — Birch, Stewart, Kolasch & Birch, LLP

(57) ABSTRACT

A photomask blank comprises a transparent substrate, a light-shielding film deposited on the substrate and comprising a metal or metal compound susceptible to fluorine dry etching, and an etching mask film deposited on the light-shielding film and comprising another metal or metal compound resistant to fluorine dry etching. When the light-shielding film is dry etched to form a pattern, pattern size variation arising from pattern density dependency is reduced, so that a photomask is produced at a high accuracy.

19 Claims, 10 Drawing Sheets

U.S. PATENT DOCUMENTS

| | | |
|---|---|---|
| 2003/0077520 A1 | 4/2003 | Smith |
| 2003/0180631 A1 | 9/2003 | Shiota et al. |
| 2004/0072081 A1 | 4/2004 | Coleman et al. |
| 2004/0229136 A1 | 11/2004 | Kaneko et al. |
| 2005/0019674 A1 | 1/2005 | Okubo et al. |
| 2005/0042526 A1 | 2/2005 | Lee et al. |
| 2005/0142463 A1 | 6/2005 | Mitsui et al. |
| 2005/0170263 A1 | 8/2005 | Mitsui et al. |
| 2005/0190450 A1 | 9/2005 | Becker et al. |
| 2006/0051681 A1 | 3/2006 | Taylor |
| 2006/0057469 A1 | 3/2006 | Kureishi et al. |

FOREIGN PATENT DOCUMENTS

| | | |
|---|---|---|
| EP | 1 321 820 A1 | 6/2003 |
| EP | 1 439 418 A2 | 7/2004 |
| EP | 1 832 925 A2 | 9/2007 |
| EP | 1 832 926 A2 | 9/2007 |
| JP | 61-138256 A | 6/1986 |
| JP | 63-85553 A | 4/1988 |
| JP | 1-142637 A | 6/1989 |
| JP | 3-116147 A | 5/1991 |
| JP | 4-75059 A | 3/1992 |
| JP | 4-246649 A | 9/1992 |
| JP | 6-95358-A A | 4/1994 |
| JP | 6-95363-A A | 4/1994 |
| JP | 7-140635 A | 6/1995 |
| JP | 10-148929 A | 6/1998 |
| JP | 2001-312043 A | 11/2001 |
| JP | 3093632 U | 2/2003 |
| JP | 2003-195479 A | 7/2003 |
| JP | 2003-195483 A | 7/2003 |
| JP | 2005-62571 A | 3/2005 |
| JP | 2006-78807 A | 3/2006 |
| WO | WO 2005/076081 A2 | 8/2005 |

OTHER PUBLICATIONS

European Search Report issued on Nov. 6, 2009 in European Patent Application No. 07251007.

Japanese Office Action issued on Mar. 31, 2010 in corresponding Japanese Patent Application No. 2006-065763.

Japanese Office Action issued on Feb. 16, 2011 in corresponding Japanese Patent Application No. 2006-065763.

Office Action in Japanese Application No. 2010-122341 mailed Sep. 29, 2010.

European Patent Office Action dated Apr. 26, 2011 for EP Application No. 07 251 015.9.

Extended European Search Report dated Apr. 29, 2011 for EP Application No. 11 00 0878.

Extended European Search Report dated Apr. 29, 2011 for EP Application No. 11 00 0879.

Extended European Search Report dated Apr. 29, 2011 for EP Application No. 11 00 0880.

PHOTOMASK BLANK AND PHOTOMASK MAKING METHOD

CROSS-REFERENCE TO RELATED APPLICATION

This application is a Divisional of application Ser. No. 11/715,368, filed on Mar. 8, 2007, now U.S. Pat. No. 7,767,367 the entire contents of which are hereby incorporated by reference and for which priority is claimed under 35 U.S.C. §120.

Application Ser. No. 11/715,368 claims priority under 35 U.S.C. §119(a) on Patent Application No. 2006-065763 filed in Japan on Mar. 10, 2006, the entire contents of which are hereby incorporated by reference.

TECHNICAL FIELD

This invention relates to photomask blanks from which are produced photomasks for use in the microfabrication of semiconductor integrated circuits, charge coupled devices (CCD), liquid crystal display (LCD) color filters, magnetic heads or the like, and a method for preparing photomasks using the photomask blanks.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shielding pattern. In an attempt to miniaturize the light-shielding pattern, if processing is carried out while maintaining the thickness of the resist film at the same level as in the prior art prior to the miniaturization, the ratio of film thickness to pattern, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film material which is etched using the resist as an etch mask, on the other hand, a number of materials have been proposed. In practice, chromium compound films are always employed because there are known a number of findings with respect to their etching and the standard process has been established. Typical of such films are light-shielding films composed of chromium compounds necessary for photomask blanks for ArF excimer laser lithography, which include chromium compound films with a thickness of 50 to 77 nm as reported in JP-A 2003-195479, JP-A 2003-195483, and Japanese Patent No. 3093632.

However, oxygen-containing chlorine dry etching which is a common dry etching process for chromium based films such as chromium compound films often has a capability of etching organic films to some extent. If etching is carried out through a thin resist film, accurate transfer of the resist pattern is difficult. It is a task of some difficulty for the resist to have both a high resolution and etch resistance that allows for high accuracy etching. Then, for the purpose of achieving high resolution and high accuracy, the light-shielding film material has to be reviewed so as to find a transition from the approach relying only on the resist performance to the approach of improving the light-shielding film performance as well.

Also, as to light-shielding film materials other than the chromium based materials, a number of studies have been made. One example of the latest studies is the use of tantalum in the light-shielding film for ArF excimer laser lithography. See JP-A 2001-312043.

On the other hand, it has long been a common practice to use a hard mask for reducing the load on resist during dry etching. For example, JP-A 63-85553 discloses $MoSi_2$ overlaid with a $SiO_2$ film, which is used as an etch mask during dry etching of $MoSi_2$ with chlorine gas. It is described that the $SiO_2$ film can also function as an antireflective film.

From the past, studies have been made on metal silicide films, especially molybdenum silicide films. They are disclosed, for example, in JP-A 63-85553, JP-A 1-142637, and JP-A 3-116147, all of which basically use a film of silicon and molybdenum=2:1. Also, JP-A 4-246649 discloses a metal silicide film. The actual fabrication process accommodates the miniaturization demand by improving conventional chromium-based light-shielding films.

For masks utilizing the ultra-resolution technology such as halftone phase shift masks and Levenson phase shift masks, on the other hand, the mask processing process includes the step of removing a portion of the light-shielding film which causes a phase shift to light, during which step selective etching must be possible between the undercoat film or substrate and the light-shielding film. Since conventional chromium-based materials are superior in this sense, chromium-based materials are on wide use.

DISCLOSURE OF THE INVENTION

The inventors continued efforts to develop a material and method for forming a finer mask pattern at a higher accuracy. Most of our experiments used chromium-based materials commonly employed in the prior art, and selected dry etching conditions containing chlorine and oxygen in transferring a resist pattern to a chromium film. In this method, a photoresist is first coated onto a photomask blank having a light-shielding film of chromium-based material. The resist film is subjected to electron beam exposure and subsequent development, for example, for thereby forming a resist pattern. Using the resist film as an etching mask, the chromium-based material is etched for transferring the resist pattern to the chromium film.

In this method, however, when the pattern width becomes finer, for example, when a resist pattern of straight lines of up to 0.4 μm wide as a pattern model is transferred to a chromium light-shielding film, a significant pattern density dependency is observed. In some cases, the resulting pattern has noticeable errors relative to the resist pattern formed on the photomask blank. That is, an isolated line with less film pattern left therearound and an isolated space with more film pattern left therearound have a significant difference in resist pattern transfer characteristics so that it is very difficult to make a high accuracy mask.

This problem is not serious when resist pattern features of more than 0.4 μm are used. In the manufacture of a photomask, the problem is not so serious if the photomask is intended for the exposure of a resist pattern of the order of 0.3 μm, but becomes serious if the photomask is to form resist pattern features of 0.1 μm or less.

Although the above problem might be overcome by avoiding the use of chromium material in the light-shielding film, a new issue arises how to acquire the hard mask function of the chromium light-shielding film that has been utilized in the etch processing of a transparent substrate and a silicon-containing phase shift material.

An object of the invention is to provide a photomask blank which endows a photomask with both a high resolution and a high accuracy etching capability for forming a finer photomask pattern, especially as needed in the photolithography involving exposure to light of a wavelength equal to or less than 250 nm such as ArF excimer laser light, i.e., a photomask blank having a sufficient process accuracy of etch processing to form a pattern with minimized pattern density dependency; and a method for preparing a photomask using the photomask blank.

The inventors found that a film which can be processed by fluorine dry etching has reduced pattern density dependency during fluorine dry etching, as compared with a chromium based film subject to oxygen-containing chlorine dry etching. Making a study on the film which can be processed by fluorine dry etching, the inventors have found that a film containing a transition metal and silicon is appropriate. It has also been found that even a film of chromium-based material can be reduced in pattern density dependency if it is made fully thin, but a chromium-based material film within such thickness range is short in light shielding.

Based on the above finding, the inventors have found that (I) a photomask blank comprising a light-shielding film composed of a metal or metal compound susceptible to fluorine dry etching, especially a material containing a transition metal and silicon, and an etching mask film disposed on the light-shielding film and composed of a metal or metal compound resistant to fluorine dry etching, (II) a photomask blank comprising a light-shielding film, an antireflective film disposed on the light-shielding film, especially an antireflective film containing a transition metal, silicon and nitrogen, and an etching mask film disposed on the antireflective film, especially an etching mask film containing chromium and free of silicon, or containing tantalum and free of silicon, or (III) a photomask blank comprising a light-shielding film, an etching mask film disposed on the light-shielding film, especially an etching mask film containing chromium with a chromium content of at least 50 atom %, and an antireflective film on the etching mask film, especially an antireflective film containing chromium and oxygen with a chromium content of less than 50 atom %, ensures that the light-shielding film is processed at a high accuracy independent of the pattern density, and that even when a phase shift film or substrate is processed by etching after pattern formation of the light-shielding film, the pattern is transferred to the phase shift film or substrate at a high accuracy.

Accordingly, the present invention provides a photomask blank and a photomask preparing method as defined below.

[1] A photomask blank from which is produced a photomask comprising a transparent substrate and a mask pattern formed thereon including transparent regions and effectively opaque regions to exposure light, said photomask blank comprising
  a transparent substrate,
  a light-shielding film disposed on the substrate, optionally with another film intervening therebetween, said light-shielding film comprising a metal or metal compound susceptible to fluorine dry etching, and
  an etching mask film formed on said light-shielding film, said mask film comprising another metal or metal compound resistant to fluorine dry etching.

[2] A photomask blank from which is produced a photomask comprising a transparent substrate and a mask pattern formed thereon including transparent regions and effectively opaque regions to exposure light, said photomask blank comprising
  a transparent substrate,
  a light-shielding film disposed on the substrate, optionally with another film intervening therebetween, said light-shielding film comprising a metal or metal compound susceptible to fluorine dry etching,
  an antireflective film formed on said light-shielding film, and
  an etching mask film formed on said antireflective film, said mask film comprising another metal or metal compound resistant to fluorine dry etching,
  said antireflective film and said etching mask film being composed of different elements or composed of the same elements in a different compositional ratio.

[3] The photomask blank of [2], wherein said antireflective film comprises the same metal as in said light-shielding film.

[4] A photomask blank from which is produced a photomask comprising a transparent substrate and a mask pattern formed thereon including transparent regions and effectively opaque regions to exposure light, said photomask blank comprising
  a transparent substrate,
  a light-shielding film disposed on the substrate, optionally with another film intervening therebetween, said light-shielding film comprising a metal or metal compound susceptible to fluorine dry etching,
  an etching mask film formed on said light-shielding film, said mask film comprising another metal or metal compound resistant to fluorine dry etching, and
  an antireflective film formed on said mask film, said antireflective film and said etching mask film being composed of different elements or composed of the same elements in a different compositional ratio.

[5] The photomask blank of [4], wherein said antireflective film comprises the same metal as in said light-shielding film.

[6] The photomask blank of any one of [2] to [5], wherein said light-shielding film, antireflective film, and etching mask film are contiguously laminated.

[7] The photomask blank of any one of [1] to [6], wherein said light-shielding film has a selectivity ratio in fluorine dry etching of at least 2 relative to said etching mask film.

[8] The photomask blank of any one of [1] to [7], wherein transparent substrate has a selectivity ratio in fluorine dry etching of at least 10 relative to said etching mask film.

[9] The photomask blank of any one of [1] to [8], wherein said etching mask film is composed of chromium alone or a chromium compound comprising chromium and at least one element selected from oxygen, nitrogen and carbon.

[10] The photomask blank of [9], wherein said chromium compound contains at least 50 atom % of chromium.

[11] The photomask blank of any one of [1] to [8], wherein said etching mask film is composed of tantalum alone or a tantalum compound comprising tantalum and free of silicon.

[12] The photomask blank of any one of [1] to [11], wherein said light-shielding film is composed of silicon alone or a silicon compound comprising silicon and at least one element selected from oxygen, nitrogen and carbon.

[13] The photomask blank of any one of [1] to [11], wherein said light-shielding film is composed of an alloy of a transition metal with silicon or a transition metal silicon compound comprising a transition metal, silicon, and at least one element selected from oxygen, nitrogen and carbon.

[14] A photomask blank according to [2], comprising
a transparent substrate,
a light-shielding film formed on the substrate, optionally with another film intervening therebetween, said light-shielding film comprising a transition metal and silicon susceptible to fluorine dry etching,
an antireflective film disposed contiguous to said light-shielding film, said antireflective film comprising a transition metal, silicon, and nitrogen, and
an etching mask film disposed contiguous to said antireflective film, said etching mask film comprising chromium and free of silicon, or comprising tantalum and free of silicon.

[15] A photomask blank according to [4], comprising
a transparent substrate,
a light-shielding film disposed on the substrate, optionally with another film intervening therebetween, said light-shielding film comprising a transition metal and silicon susceptible to fluorine dry etching,
an etching mask film disposed contiguous to said light-shielding film, said etching mask film comprising chromium with a chromium content of at least 50 atom %, and
an antireflective film disposed contiguous to said etching mask film, said antireflective film comprising chromium and oxygen with a chromium content of less than 50 atom %.

[16] The photomask blank of any one of [13] to [15], wherein said transition metal is at least one element selected from the group consisting of titanium, vanadium, cobalt, nickel, zirconium, niobium, molybdenum, hafnium, tantalum, and tungsten.

[17] The photomask blank of any one of [13] to [15], wherein said transition metal is molybdenum.

[18] The photomask blank of any one of [13] to [17], wherein said light-shielding film further comprises nitrogen with a nitrogen content of 5 atom % to 40 atom %.

[19] The photomask blank of any one of [1] to [18], wherein said etching mask film has a thickness of 2 to 30 nm.

[20] The photomask blank of any one of [1] to [19], wherein a phase shift film intervenes as the other film between the laminated films.

[21] The photomask blank of [20], wherein said phase shift film is a halftone phase shift film.

[22] A method for preparing a photomask, comprising patterning the photomask blank of any one of [1] to [21].

[23] The method of [22], comprising fluorine dry etching said light-shielding film through said etching mask film as an etching mask.

[24] The method of [22] or [23], comprising fluorine dry etching said transparent substrate through said etching mask film as an etching mask.

[25] The method of any one of [22] to [24], wherein said photomask is a Levenson mask.

BENEFITS OF THE INVENTION

As compared with photomask blanks having conventional light-shielding films, the photomask blank of the invention has the advantage that when the light-shielding film is dry etched to form a pattern, the variation of pattern feature size arising from the pattern density dependency is reduced. This enables to produce a mask at a high accuracy. When the photomask blank of the invention is applied to a halftone phase shift mask, chromeless phase lithography (CPL) mask or Levenson mask, photomasks for super-resolution exposure can be manufactured at a high accuracy.

According to the invention, a fine photomask pattern can be formed at a high accuracy because the light-shielding film can be patterned by fluorine dry etching featuring minimized side etching and ease of control and because the resist film can be made thin. In an embodiment wherein the photomask blank includes a phase shift film, the phase shift film can be etched utilizing the etching mask film while the thickness of the etching mask film can be set at the minimum level necessary for the etching of the phase shift film. Also in the case of a Levenson mask or CPL mask wherein the transparent substrate is patterned by etching, the thickness of the etching mask film can be set at the minimum necessary level so that a fine photomask pattern can be formed at a high accuracy.

DESCRIPTION OF THE PREFERRED EMBODIMENTS

The present invention is directed to a photomask blank from which a photomask comprising a transparent substrate and a mask pattern formed thereon including transparent regions and effectively opaque regions to exposure light is produced. The photomask blank comprises a transparent substrate, a light-shielding film disposed on the substrate, optionally with another film intervening therebetween, the light-shielding film comprising a metal or metal compound susceptible to fluorine dry etching, and an etching mask film formed on the light-shielding film, the mask film comprising another metal or metal compound resistant to fluorine dry etching. As used herein in connection with fluorine dry etching, the term "susceptible" means that the material can be etched by fluorine dry etching, and the term "resistant" means that the material withstands fluorine dry etching.

Preferred embodiments of the photomask blank of the invention include the following two embodiments.

The first embodiment is a photomask blank comprising a transparent substrate, a light-shielding film disposed on the substrate, optionally with another film intervening therebetween, the light-shielding film comprising a metal or metal compound susceptible to fluorine dry etching, an antireflective film formed on the light-shielding film, and an etching mask film formed on the antireflective film, the etching mask film comprising another metal or metal compound resistant to fluorine dry etching.

Figure 1A:
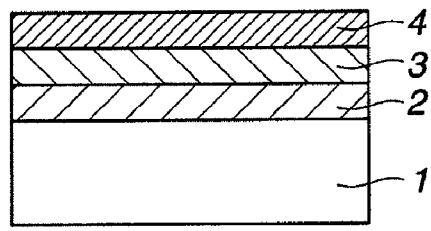
FIG. 1 is a cross-sectional view showing one exemplary photomask blank in a first embodiment of the invention, FIG. 1A corresponding to a light-shielding film disposed directly on a transparent substrate and FIG. 1B corresponding to a light-shielding film disposed on a transparent substrate via a phase shift film.
Figure 1B:
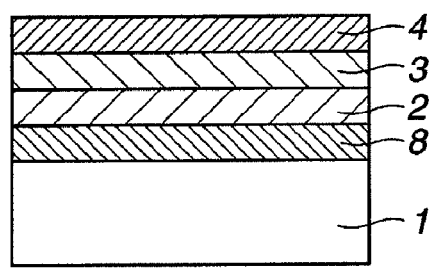

More particularly, the blank having a light-shielding film disposed on a transparent substrate directly (without another intervening film) includes one exemplary blank, as illustrated in FIG. 1A, comprising a light-shielding film 2 disposed directly on a transparent substrate 1, an antireflective film 3 and an etching mask film 4 disposed on the light-shielding film 2 in sequence and in close contact. The blank having a light-shielding film disposed on a transparent substrate via another intervening film includes a blank having a phase shift film intervening as the other film between laminated films, specifically one exemplary blank, as illustrated in FIG. 1B, comprising a light-shielding film 2 disposed on a transparent substrate 1 via a phase shift film 8 intervening therebetween, an antireflective film 3 and an etching mask film 4 disposed on the light-shielding film 2 in sequence and in close contact. In the first embodiment, it is preferred that the antireflective film contain the same metal as in the light-shielding film.

The second embodiment is a photomask blank comprising a transparent substrate, a light-shielding film disposed on the substrate, optionally with another film intervening therebetween, the light-shielding film comprising a metal or metal compound susceptible to fluorine dry etching, an etching mask film formed on the light-shielding film, the etching mask film comprising another metal or metal compound resistant to fluorine dry etching, and an antireflective film formed on the etching mask film.

Figure 2A:
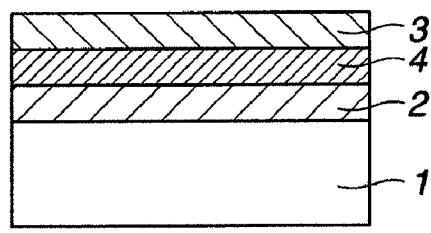
FIG. 2 is a cross-sectional view showing one exemplary photomask blank in a second embodiment of the invention, FIG. 2A corresponding to a light-shielding film disposed directly on a transparent substrate and FIG. 2B corresponding to a light-shielding film disposed on a transparent substrate via a phase shift film.
Figure 2B:
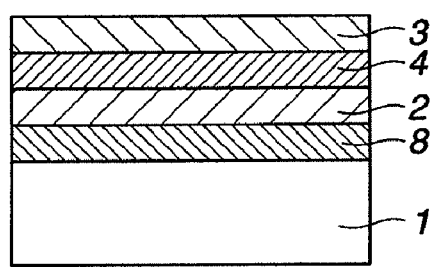

More particularly, the blank having a light-shielding film disposed on a transparent substrate directly (without another intervening film) includes one exemplary blank, as illustrated in FIG. 2A, comprising a light-shielding film 2 disposed directly on a transparent substrate 1, an etching mask film 4 and an antireflective film 3 disposed on the light-shielding film 2 in sequence and in close contact. The blank having a light-shielding film disposed on a transparent substrate via another intervening film includes a blank having a phase shift film intervening as the other film between laminated films, specifically one exemplary blank, as illustrated in FIG. 2B, comprising a light-shielding film 2 disposed on a transparent substrate 1 via a phase shift film 8 intervening therebetween, an etching mask film 4 and an antireflective film 3 disposed on the light-shielding film 2 in sequence and in close contact. In the second embodiment, it is preferred that the antireflective film contain the same metal as in the etching mask film.

In either of the embodiments, the antireflective film and the etching mask film are composed of different elements or composed of the same elements in a different compositional ratio.

The etching mask film is a film serving predominantly for an etching mask function during fluorine dry etching of a light-shielding film or the like, the light-shielding film is a film serving predominantly for a shielding function to exposure light, and the antireflective film is a film serving predominantly for an antireflection function to exposure light or inspection light, that is, a function of reducing reflectance, on use in photomask form. As used herein, the term "metal" is inclusive of silicon when referred to without particular limits.

The photomask blank constructed as above enables to effectively control a surface reflectance, to form a fine pattern at a high accuracy during dry etch processing of the light-shielding film, to reduce a variation of pattern feature size due to pattern density dependency, and to produce a higher accuracy photomask.

More particularly, the light-shielding film is composed of a metal or metal compound susceptible to fluorine dry etching, and preferably silicon alone, an alloy containing silicon as a metal, or a metal compound containing silicon as a metal (which are sometimes collectively referred to as "silicon-containing material", hereinafter). This light-shielding film improves the pattern density dependency during dry etching, over the commonly used chromium-based light-shielding films. Since silicon has a higher coefficient of absorption to short wavelength light than the commonly used chromium-based materials, the silicon-containing material provides a sufficient light-shielding function even in a thin film form, permitting to reduce the thickness of the light-shielding film.

Further, when the light-shielding film is overlaid with an etching mask film which is resistant to fluorine-based gas used in etching of the light-shielding film, the etching mask film functions as an etching mask during fluorine dry etching. In this case, the resist is merely required to function as an etching mask only at the time of patterning the etching mask film, and then the resist film can be made sufficiently thin to facilitate formation of a fine resist pattern. Moreover, the etching mask film prevents the pattern cross-sectional shape from being exacerbated by thinning of the resist film during dry etching.

On the other hand, the antireflective film reduces surface reflectance, inhibiting the reflection of exposure light on the photomask surface.

The term "fluorine dry etching" as used herein refers to dry etching using a fluorine-containing gas. The fluorine-containing gas may be any gas containing fluorine element, specifically fluorine gas, gases containing carbon and fluorine such as $CF_4$ and $C_2F_6$, gases containing sulfur and fluorine such as $SF_6$, or a mixture of a fluorine-free gas such as helium and a fluorine-containing gas. Other gases such as oxygen may be added thereto if necessary.

While all currently used super-resolution photomasks including halftone phase shift masks, chromeless masks and Levenson masks are designed to increase the light contrast in lithography by utilizing the interference effect of phase different light, the phase of light transmitted by the mask is controlled by the material and film thickness of a phase shifter formed on the mask. In the manufacture of super-resolution photomasks utilizing the phase shift effect as currently widely employed, a pattern of phase shifter is formed by a method involving providing a photomask blank having a light-shielding film deposited thereon, first patterning the light-shielding film formed on the phase shift film or transparent substrate, then transferring the pattern to the phase shift film or transparent substrate. Therefore, it is very important that the pattern of the light-shielding film be accurately defined.

The materials of which ordinary phase shift films used in phase shift masks are made are transition metal silicide having oxygen and/or nitrogen added thereto in the case of halftone phase shift masks, and transparent substrates themselves or silicon oxide layers thereon in the case of chromeless masks and Levenson masks. In either case, these materials are processed using fluorine dry etching. Then, chromium-based materials are used in the prior art as the light-shielding film material. The chromium-based materials are satisfactory light-shielding film materials because they are resistant under fluorine dry etching conditions, can serve as a satisfactory etching mask during fluorine dry etching, and can be removed under chlorine-containing dry etching conditions which do not cause damage to the silicon-containing material, for example, chlorine dry etching, typically dry etching with an etchant gas containing chlorine and oxygen.

However, since the light-shielding film used in the present invention is a film susceptible to fluorine dry etching, it does not function as an etching mask for a phase shift film or transparent substrate to be etched by fluorine dry etching. Then a film having resistance to fluorine dry etching is separately formed as the etching mask film so that the etching mask film may function as an etching mask for a phase shift film or transparent substrate.

On the other hand, the problem that the accuracy of processing of conventional chromium-based light-shielding film materials lowers due to the pattern density dependency becomes quite serious in the manufacture of a photomask intended for exposure of a pattern with a feature size equal to or less than 0.1 µm. Then, the photomask blank of the invention solves the problem of processing accuracy by using a material susceptible to fluorine dry etching, typically a silicon-containing material in at least a portion, preferably the entirety of the light-shielding film, like the phase shift film or transparent substrate material.

The illustrative film arrangement of the photomask blank is generally divided into one mode wherein the etching mask film is finally removed during the photomask manufacturing process and another mode wherein the etching mask film is unremoved or left.

The photomask blank in the first embodiment may be used as a photomask blank of the type wherein the etching mask film is finally removed during the photomask manufacturing process. With this film arrangement, when the etching mask film is stripped off, the antireflective film is present on the outermost surface side of the photomask so that the reflectance of the photomask is controlled fully low. In this case, it is preferred that the antireflective film can be etched under the same conditions as the etching of the light-shielding film. To this end, it is preferred that the antireflective film contain the same metal as the metal in the light-shielding film, and more preferably the antireflective film be composed of a metal compound containing more oxygen and nitrogen than the light-shielding film.

The antireflective film containing the same metal as in the light-shielding film can be etched along with the light-shielding film. That is, the light-shielding film and the antireflective film can be etched together by single dry etching while the etching mask film serves as a mask. It is also preferred that the antireflective film be formed of a silicon-containing material, because a low reflectance is readily available even when the exposure wavelength is of ArF excimer laser or the like.

Also, for the photomask blank of the first embodiment or the photomask manufacturing process, there is a situation that defect inspection is performed while the etching mask film is present at the outermost surface of the photomask blank or photomask. If it is necessary to adjust the reflectance of the etching mask film in this situation, a film having an antireflection function may be further formed on the etching mask film. The film having an antireflection function thus formed on the etching mask film may be finally removed together with the etching mask film.

The photomask blank of the first embodiment may also be used in the mode where the etching mask film is left as part of the mask after the mask manufacture. This mode corresponds to a case where the etching mask film also contributes to an antireflection function complementary to the antireflective film, or a case where the etching mask film functions as a protective film against the chemicals used for cleaning or other purpose.

Although the etching mask film may be constructed such that a single film bears double functions, a function of etching mask and a function of antireflective film, the etching mask film can be reduced to the minimum permissible thickness to function as an etching mask if the function of etching mask is separated from the function of antireflective film. Where a single film bears both an etching mask function and an antireflective film function, the etching mask function is reduced if the film is set to a low light attenuation by modification of film nature. In contrast, where the etching mask film and the antireflective film are formed independently, both a low light attenuation and a high etch resistance are compatible.

It is noted that the antireflective film and the etching mask film are composed of different elements or of the same elements in a different compositional ratio. In the first embodiment, the antireflective film is preferably composed of a metal or metal compound susceptible to fluorine dry etching, for example, a silicon-containing material. Examples of the silicon-containing material include materials containing silicon as a sole metal such as silicon alone, and silicon compounds containing silicon and at least one element selected from oxygen, nitrogen and carbon. More illustrative examples of the silicon compound include silicon oxide, silicon nitride, silicon oxynitride, silicon oxycarbide, silicon nitride carbide, and silicon oxide nitride carbide.

Compounds containing silicon and a metal other than silicon as the metal are also useful and include alloys of a transition metal with silicon, and transition metal silicon compounds containing a transition metal, silicon, and at least one element selected from oxygen, nitrogen and carbon. More illustrative examples of the transition metal silicon compound include transition metal silicon oxide, transition metal silicon nitride, transition metal silicon oxynitride, transition metal silicon oxycarbide, transition metal silicon nitride carbide, and transition metal silicon oxide nitride carbide.

The transition metal is preferably at least one element selected from the group consisting of titanium, vanadium, cobalt, nickel, zirconium, niobium, molybdenum, hafnium, tantalum, and tungsten. Inter alia, molybdenum is more preferred for dry etching amenability.

In the photomask blank of the first embodiment, the silicon-containing material of which the antireflective film is made is susceptible to fluorine dry etching and can be made susceptible to oxygen-free chlorine dry etching as well by a choice of its composition.

The antireflective film preferably has a composition consisting essentially of 10 atom % to 80 atom %, specifically 30 atom % to 50 atom % of silicon, 0 atom % to 60 atom %, specifically 0 atom % to 40 atom % of oxygen, 0 atom % to 57 atom %, specifically 20 atom % to 50 atom % of nitrogen, 0 atom % to 20 atom %, specifically 0 atom % to 5 atom % of carbon, and 0 atom % to 35 atom %, specifically 1 atom % to 20 atom % of transition metal.

In the invention, the antireflective film may have a single layer structure or a multilayer structure. The single layer structure simplifies the film construction and the process reflective thereon.

In some cases, the adhesion between the antireflective film and the light-shielding film, etching mask film or the like is low enough for pattern defects to occur; and when a resist film is formed directly on an antireflective film during the photomask manufacture, the resist pattern is degraded in cross-sectional shape due to footing and necking. In the former case, the adhesion can be improved by constructing a portion of the antireflective film which is contiguous to the light-shielding film, etching mask film or the like, or a portion of the antireflective film which is contiguous to the resist film, that is, one or both of opposite surface portions of the antireflective film in a thickness direction in the case of single layer structure, and one or both of remotest layers of the antireflective film in a thickness direction in the case of multilayer structure, from a nitrogen and/or oxygen-containing material, for example, and adjusting the content of nitrogen and/or oxygen.

In the latter case, the perpendicularity in cross-sectional shape of an etching pattern can be improved by forming the antireflective film such that its composition is graded continuously or stepwise in a thickness direction. These structures can be readily formed by controlling the parameters of reactive sputtering.

In the photomask blank of the first embodiment, the antireflective film with compositional grading in a thickness direction preferably has a composition consisting essentially of 0 atom % to 90 atom %, specifically 10 atom % to 90 atom % of silicon, 0 atom % to 67 atom %, specifically 5 atom % to 67 atom % of oxygen, 0 atom % to 57 atom %, specifically 5 atom % to 50 atom % of nitrogen, 0 atom % to 20 atom %, specifically 0 atom % to 5 atom % of carbon, and 0 atom % to 95 atom %, specifically 1 atom % to 20 atom % of transition metal.

Also, in the mode where the etching mask film is finally unremoved or left in the photomask manufacture process, the photomask blank of the second embodiment may also be employed. In this case, the antireflective film should preferably be resistant to the etching of the light-shielding film.

In this case, the antireflective film preferably contains the same metal as the metal in the etching mask film. Where the antireflective film is overlaid with another film, for example, a film for improving adhesion to the resist film, the other film should preferably contain the same metal as the metal in the etching mask film. With this construction, the antireflective film can be removed by the same process as the etching mask film, and still further, the other film can also be removed by the same process as the etching mask film. The antireflective film may also be assigned to a mask function complementary to the etching mask film.

It is noted that the antireflective film and the etching mask film are composed of different elements or of the same elements in a different compositional ratio. In the second embodiment, the antireflective film is typically composed of chromium alone, or chromium compounds containing chromium and at least one element selected from oxygen, nitrogen and carbon and should preferably be free of silicon. More illustrative examples of the chromium compound include chromium oxide, chromium nitride, chromium oxynitride, chromium oxycarbide, chromium nitride carbide, and chromium oxide nitride carbide.

This antireflective film preferably has a composition consisting essentially of 30 atom % to 100 atom %, specifically 30 atom % to 70 atom %, more specifically 35 atom % to 50 atom % of chromium, 0 atom % to 60 atom %, specifically 20 atom % to 60 atom % of oxygen, 0 atom % to 50 atom %, specifically 3 atom % to 30 atom % of nitrogen, and 0 atom % to 20 atom %, specifically 0 atom % to 5 atom % of carbon.

In the photomask blank of the second embodiment, the antireflective film with compositional grading in a thickness direction preferably has a composition consisting essentially of 30 atom % to 100 atom %, specifically 35 atom % to 90 atom % of chromium, 0 atom % to 60 atom %, specifically 3 atom % to 60 atom % of oxygen, 0 atom % to 50 atom %, specifically 3 atom % to 50 atom % of nitrogen, and 0 atom % to 30 atom %, specifically 0 atom % to 20 atom % of carbon.

The light-shielding film used herein is preferably composed of a metal or metal compound susceptible to fluorine dry etching, for example, a silicon-containing material. Examples of the silicon-containing material include silicon alone, and silicon compounds containing silicon and at least one element selected from oxygen, nitrogen and carbon. More illustrative examples of the silicon compound include silicon oxide, silicon nitride, silicon oxynitride, silicon oxycarbide, silicon nitride carbide, and silicon oxide nitride carbide.

Also preferred are alloys of a transition metal with silicon, and transition metal silicon compounds containing a transition metal, silicon, and at least one element selected from oxygen, nitrogen and carbon. More illustrative examples of the transition metal silicon compound include transition metal silicon oxide, transition metal silicon nitride, transition metal silicon oxynitride, transition metal silicon oxycarbide, transition metal silicon nitride carbide, and transition metal silicon oxide nitride carbide.

The transition metal is preferably at least one element selected from the group consisting of titanium, vanadium, cobalt, nickel, zirconium, niobium, molybdenum, hafnium, tantalum, and tungsten. Inter alia, molybdenum is more preferred for dry etching amenability.

The silicon-containing material of which the light-shielding film is made is susceptible to fluorine dry etching and can be made susceptible to oxygen-free chlorine dry etching as well by a choice of its composition.

The light-shielding film preferably has a composition consisting essentially of 10 atom % to 95 atom %, specifically 30 atom % to 95 atom % of silicon, 0 atom % to 50 atom %, specifically 0 atom % to 30 atom % of oxygen, 0 atom % to 40 atom %, specifically 0 atom % to 20 atom % of nitrogen, 0 atom % to 20 atom %, specifically 0 atom % to 5 atom % of carbon, and 0 atom % to 35 atom %, specifically 1 atom % to 20 atom % of transition metal.

In the invention, the light-shielding film may have a single layer structure or a multilayer structure. The single layer structure simplifies the film construction and the process reflective thereon.

In the event that the adhesion between the light-shielding film and the etching mask film, antireflective film, transparent substrate, phase shift film or the like is low enough for pattern defects to occur, the adhesion can be improved by constructing a portion of the light-shielding film which is contiguous to the etching mask film, antireflective film, transparent substrate, phase shift film or the like, that is, one or both of opposite surface portions of the light-shielding film in a thickness direction in the case of single layer structure, and one or both of remotest layers of the light-shielding film in a thickness direction in the case of multilayer structure, from a nitrogen and/or oxygen-containing material, for example, and adjusting the content of nitrogen and/or oxygen. Also, the perpendicularity in cross-sectional shape of an etching pattern can be improved by forming the light-shielding film such that its composition is graded continuously or stepwise in a thickness direction. These structures can be readily formed by controlling the parameters of reactive sputtering.

The light-shielding film with compositional grading in a thickness direction preferably has a composition consisting essentially of 10 atom % to 95 atom %, specifically 15 atom % to 95 atom % of silicon, 0 atom % to 60 atom %, specifically 0 atom % to 30 atom % of oxygen, 0 atom % to 57 atom %, specifically 0 atom % to 40 atom % of nitrogen, 0 atom % to 30 atom %, specifically 0 atom % to 20 atom % of carbon, and 0 atom % to 35 atom %, specifically 1 atom % to 20 atom % of transition metal.

When the silicon-containing material contains a transition metal and silicon, a choice of compositional ratio is possible over a wide range. For example, a choice of compositional ratio of transition metal to silicon in the range from 1:4 to 1:15 (atomic ratio) advantageously enhances the inertness to chemicals used in cleaning and other purposes. Even when the compositional ratio of transition metal to silicon is outside the range, the inclusion of nitrogen, especially in a nitrogen content of 5 atom % to 40 atom %, imparts the chemical inertness required and is effective for reducing damages during oxygen-containing chlorine dry etching for the etching of a Cr film used as the etching mask film. At this time, the ratio of transition metal to silicon may be in a range from 1:1 to 1:10 (atomic ratio), for example.

The light-shielding film preferably has a thickness of 10 to 80 nm. A film with a thickness of less than 10 nm may fail to provide the desired light-shielding effect. A film with a thickness of more than 80 nm may be difficult to process at a high accuracy when combined with a thin resist film with a thickness equal to or less than 250 nm, or cause the substrate to bow due to film stress.

The light-shielding film used herein is a film imparting a light-shielding effect to exposure light during use of the photomask and is not particularly limited. When the photomask blank is of the layer construction wherein when the photomask blank is processed into a photomask, the light-shielding film mainly plays the light shielding role of the photomask, for example, it is a photomask blank wherein the light-shielding film is disposed directly on the transparent substrate as illustrated in FIGS. 1A and 2A, or a photomask blank wherein the light-shielding film is disposed on the transparent substrate via a phase shift film as illustrated in FIGS. 1B and 2B, the phase shift film being of full transmission type, the composition and thickness of the light-shielding film are preferably adjusted so that it may have an optical density of 1 to 4 relative to the exposure light. In this case, the light-shielding film preferably has a thickness of 20 to 80 nm.

On the other hand, when the photomask blank is of the construction wherein another film of mainly playing the light shielding role of the photomask is present in addition to the light-shielding film, for example, it is a photomask blank wherein the light-shielding film is disposed on the transparent substrate via a phase shift film as illustrated in FIGS. 1B and 2B, the phase shift film being a halftone phase shift film having a transmittance of exposure light of about 5% to about 30%, the composition and thickness of the light-shielding film are preferably adjusted so that it may have an optical density of 0.2 to 4 relative to the exposure light. In this case, the light-shielding film preferably has a thickness of 10 to 70 nm.

With respect to the thickness of the antireflective film used herein, an antireflection effect is generally obtained at a thickness in the range of 8 to 30 nm, although the exact thickness varies with the wavelength of light used in inspection required in the manufacture or use of the photomask and the composition of the antireflective film. A thickness in the range of 8 to 25 nm is preferred for the ArF excimer laser lithography.

In the photomask blank of the first embodiment, the preferred antireflective film made of silicon-containing material has an appropriate thickness of 10 to 30 nm. In the photomask blank of the second embodiment, the preferred antireflective film made of chromium alone or chromium compound has an appropriate thickness of 8 to 30 nm.

The etching mask film resistant to fluorine dry etching functions as an etching mask when the silicon-containing compound of which the light-shielding film is made is etched, and contributes to increase the accuracy of etch processing of that film. It also functions as an etching mask when the transparent substrate or phase shift film underlying the light-shielding film is etched by fluorine dry etching.

The etching mask film used herein must be resistant to fluorine dry etching. When an etching selectivity ratio between the etching mask film and the light-shielding film during fluorine dry etching (i.e., selectivity ratio of the light-shielding film to the etching mask film during fluorine dry etching) is equal to or more than 2, an advantageous photomask blank capable of forming a fine pattern while minimizing side etching is obtained. An etching selectivity ratio in the range is thus preferable.

When an etching selectivity ratio between the etching mask film and the transparent substrate during fluorine dry etching (i.e., selectivity ratio of the transparent substrate to the etching mask film during fluorine dry etching) is equal to or more than 10, the photomask blank can be a Levenson photomask blank wherein a photomask is formed by etching the transparent substrate, or a photomask blank best suited for the manufacture of CPL photomasks.

For these etching mask films, chromium-based materials or tantalum-containing, silicon-free materials may be used.

Examples of the chromium-based material include chromium alone, and chromium compounds containing chromium and at least one element selected from oxygen, nitrogen and carbon and preferably free of silicon. More illustrative examples of the chromium compound include chromium oxide, chromium nitride, chromium oxynitride, chromium oxycarbide, chromium nitride carbide, and chromium oxide nitride carbide. These materials are highly resistant to fluorine dry etching.

An etching mask film with a chromium content of at least 50 atom %, especially at least 60 atom % is preferred because it has good resistance to fluorine dry etching and imparts full etching selectivity to the light-shielding film and/or transparent substrate, and in addition, it can be patterned by dry etching under chlorine and oxygen-containing dry etching conditions.

When the chromium-based material consists essentially of 50 atom % to 100 atom %, specifically 60 atom % to 100 atom % of chromium, 0 atom % to 50 atom %, specifically 0 atom % to 40 atom % of oxygen, 0 atom % to 50 atom %, specifically 0 atom % to 40 atom % of nitrogen, and 0 atom % to 20 atom %, specifically 0 atom % to 10 atom % of carbon, for example, an etching mask film which provides full etching selectivity to the light-shielding film and/or transparent substrate can be formed therefrom.

The etching mask film used herein may have a single layer structure or a multilayer structure. The single layer structure simplifies the film construction and the process reflective thereon.

In some cases, the adhesion between the etching mask film and the light-shielding film, antireflective film or the like is low enough for pattern defects to occur; and when a resist film is formed directly on an etching mask film during the photomask manufacture, the resist pattern is degraded in cross-sectional shape due to footing and necking. In the former case, the adhesion can be improved by constructing a portion of the etching mask film which is contiguous to the light-shielding film, antireflective film or the like, or a portion of the etching mask film which is contiguous to the resist film, that is, one or both of opposite surface portions of the etching mask film in a thickness direction in the case of single layer structure, and one or both of remotest layers of the etching mask film in a thickness direction in the case of multilayer structure, from a nitrogen and/or oxygen-containing material, for example, and adjusting the content of nitrogen and/or oxygen. In the latter case, the perpendicularity in cross-sectional shape of an etching pattern can be improved by forming the etching mask film such that its composition is graded continuously or stepwise in a thickness direction. These structures can be readily formed by controlling the parameters of reactive sputtering.

The etching mask film with compositional grading in a thickness direction preferably has a composition consisting essentially of 50 atom % to 100 atom %, specifically 60 atom % to 100 atom % of chromium, 0 atom % to 60 atom %, specifically 0 atom % to 50 atom % of oxygen, 0 atom % to 50 atom %, specifically 0 atom % to 40 atom % of nitrogen, and 0 atom % to 20 atom %, specifically 0 atom % to 10 atom % of carbon.

The tantalum-containing material loses resistance to fluorine dry etching if it contains silicon. However, in the absence of silicon, a tantalum-containing material, for example, tantalum alone has a sufficient etching resistance to allow for selective etching relative to the silicon-containing material. Also, tantalum compounds containing tantalum, free of silicon, such as materials based on tantalum and zirconium, or tantalum and hafnium offer a satisfactory etching selectivity ratio relative to the silicon-containing material. It is noted that unlike the chromium-based materials, the tantalum-containing materials can be etched by oxygen-free chlorine dry etching.

It is noted that an etching mask film having resistance to fluorine dry etching should be fully reduced in thickness so that the problem of density dependency of a transferred pattern may not arise during dry etching. This avoids the problem of pattern density dependency from which the etching mask film suffers. As compared with prior art photomask blanks using a film resistant to fluorine dry etching as the light-shielding film, the photomask blank of the invention apparently reduces the density dependency of a transferred pattern.

The thickness of the etching mask film may be properly selected in accordance with its construction. In general, when the etching mask film has a thickness of 2 to 55 nm, it exerts a sufficient etching mask function to etch the silicon-containing material of the light-shielding film and to etch the phase shift film and transparent substrate along with the light-shielding film. To further reduce its pattern density dependency, the etching mask film is preferably adjusted to a thickness of 2 to 30 nm.

In the photomask blank of the invention, in order that films having light-shielding property deposited on the transparent substrate (which corresponds to a light-shielding film, an antireflective film imparting complementary light-shielding property (an antireflective film of a certain type can impart complementary light-shielding property), an etching mask film imparting complementary light-shielding property when the etching mask film is left after processing into a photomask (an etching mask film of a certain type can impart complementary light-shielding property), and optionally, a halftone phase shift film) function as a whole to provide sufficient light-shielding property, the photomask blank should desirably be processed into a photomask in which the films have an overall optical density OD of 1 to 4 relative to exposure light during use of the photomask.

In case where the photomask is used with the etching mask film removed, the combination of light-shielding film and antireflective film, and if a halftone phase shift film is used together, the combination of light-shielding film, antireflective film and halftone phase shift film should preferably have an optical density OD of at least 2.5, more preferably at least 2.8, and even more preferably at least 3.0.

In case where the photomask is used without removing the etching mask film, the combination of etching mask film, light-shielding film and antireflective film, and if a halftone phase shift film is used together, the combination of etching mask film, light-shielding film, antireflective film and halftone phase shift film should preferably have an optical density OD of at least 2.5, more preferably at least 2.8, and even more preferably at least 3.0.

For the light-shielding film containing light elements such as oxygen, nitrogen and carbon, in particular, sufficient light-shielding property may not be obtained when the content of light elements exceeds a certain level. When the photomask blank of the invention is adapted for exposure to light with a wavelength equal to or less than 193 nm (to which the invention is advantageously applied), for example, exposure to ArF excimer laser with a wavelength 193 nm, or exposure to $F_2$ laser with a wavelength 153 nm, it is preferred that the light-shielding film have a nitrogen content of up to 40 atom %, a carbon content of up to 20 atom %, an oxygen content of up to 10 atom %, and especially a total content of nitrogen, carbon and oxygen of up to 40 atom %. Satisfactory light shielding property is obtained when at least a portion, preferably the entirety of the light-shielding film has a composition within the range.

Two embodiments are especially preferred as the photomask blank of the invention.

The first embodiment is a photomask blank comprising a transparent substrate, a light-shielding film disposed on the substrate, optionally with another film intervening therebetween, the light-shielding film comprising a metal or metal compound susceptible to fluorine dry etching, an antireflective film disposed contiguous to the light-shielding film and comprising a transition metal, silicon and nitrogen, and an etching mask film disposed contiguous to the antireflective film, the mask film comprising chromium and free of silicon, or comprising tantalum and free of silicon.

The second embodiment is a photomask blank comprising a transparent substrate, a light-shielding film disposed on the substrate, optionally with another film intervening therebetween, the light-shielding film comprising a transition metal and silicon susceptible to fluorine dry etching, an etching mask film disposed contiguous to the light-shielding film and comprising chromium with a chromium content of at least 50 atom %, preferably at least 60 atom %, and an antireflective film disposed contiguous to the mask film and comprising chromium and oxygen with a chromium content of less than 50 atom %, preferably up to 45 atom %.

The transparent substrate is preferably selected from substrates composed mainly of silicon oxide, typically quartz substrates. When a phase shift film is used, it may be either a full transmission phase shift film or a halftone phase shift film, for example, a halftone phase shift film having a transmittance of 5 to 30%. The phase shift film used herein is preferably a film which can be etched by fluorine dry etching. Examples of the material of which the phase shift film is made include silicon-containing materials, preferably transition metal silicon compounds containing a transition metal, silicon and at least one element selected from oxygen, nitrogen and carbon, more preferably transition metal silicon compounds containing a transition metal, silicon and at least one of nitrogen and oxygen. Examples of the silicon-containing material are as exemplified above as the silicon-containing compound for the light-shielding film; and examples of the transition metal are as exemplified above as the transition metal for the light-shielding film. The phase shift film has a thickness which is selected so as to shift the phase of light by a predetermined quantity, typically 180° relative to the exposure light during the use of the photomask.

The silicon-containing material of the phase shift film is susceptible to fluorine dry etching, but can be modified to be resistant to chlorine gas etching by a proper choice of its composition. If the light-shielding film and antireflective film in the photomask blank of the first embodiment, or the light-shielding film in the photomask blank of the second embodiment is constructed of a silicon-containing material susceptible to oxygen-free chlorine gas etching, then selective etching is possible between the phase shift film and the light-shielding film and antireflective film in the first embodiment, or between the phase shift film and the light-shielding film in the second embodiment, during oxygen-free chlorine gas etching.

Any of the etching mask film, light-shielding film, antireflective film, and phase shift film can be deposited by well-known methods. Among others, the sputtering process is preferable because a homogeneous film can be formed most easily. The sputtering process may be either DC sputtering, RF sputtering or the like.

The target and sputtering gas are selected in accordance with the desired film composition. When it is desired to deposit a film of a chromium-based material, for example, deposition may be carried out by a method as used for prior art chromium-based films. One commonly used method is reactive sputtering using a chromium target and argon gas alone, a reactive gas such as nitrogen alone, or a mixture of a reactive gas such as nitrogen and an inert gas such as argon. See JP-A 7-140635, for example. The flow rate of sputtering gas may be adjusted in accordance with the film properties, that is, may be set constant during deposition, or when it is desired to change the oxygen or nitrogen content in a thickness direction of the film being deposited, be varied in accordance with the desired composition.

When a film containing a transition metal and silicon is to be deposited, the target used may be a single target containing silicon and transition metal in a controlled ratio. Alternatively, a ratio of silicon to transition metal may be adjusted by selecting appropriate ones from a silicon target, a transition metal target, and targets of silicon and transition metal (transition metal silicide targets) and controlling the sputtering area of the selected targets or the power applied to the selected targets. It is noted that when the film contains light elements such as oxygen, nitrogen, and carbon, such a film can be deposited by reactive sputtering wherein an oxygen-containing gas, nitrogen-containing gas and/or carbon-containing gas is added to the sputtering gas as a reactive gas.

When a film containing tantalum and free of silicon is to be deposited, it may be deposited by a method as used for the film containing transition metal and silicon described just above, using a tantalum-containing target, but not a silicon-containing target.

According to the invention, a photomask is obtained from the above-described photomask blank by patterning the respective films of the blank for forming on the transparent substrate a mask pattern including transparent regions and effectively opaque regions to exposure light.

In the photomask blank of the invention, the light-shielding film can be fluorine dry etched using the etching mask film as an etching mask, and the transparent substrate can be fluorine dry etched using the etching mask film as an etching mask.

Referring to the drawings, the processes of manufacturing photomasks are described in detail.

(1) The Photomask Manufacturing Process Wherein the Etching Mask Film is Removed (Binary Mask)

Figure 3A:
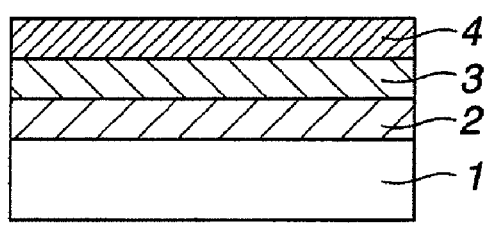
FIG. 3 schematically illustrates steps of a method for preparing a photomask according to the invention, the method using the photomask blank of the first embodiment and producing a binary mask with the etching mask film being removed.
Figure 3B:
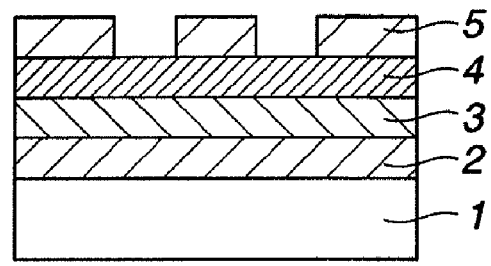
Figure 3C:
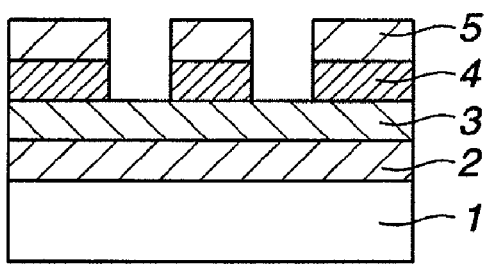
Figure 3D:
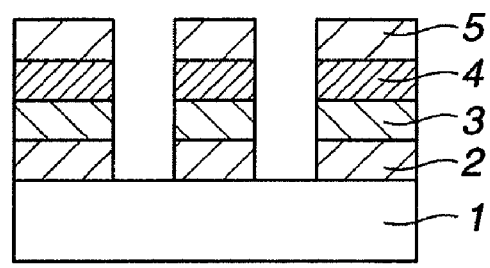
Figure 3E:
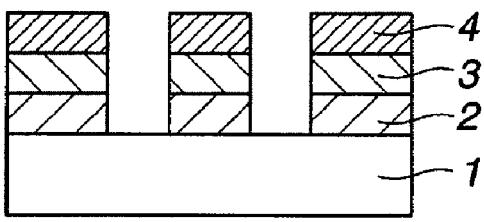
Figure 3F:
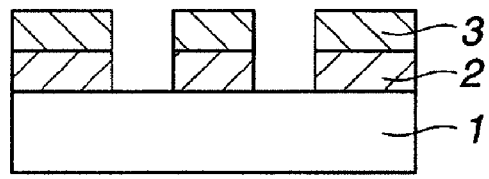

The process starts with a photomask blank comprising a light-shielding film 2, an antireflective film 3, and an etching mask film 4 deposited in sequence on a transparent substrate 1 according to the first embodiment (FIG. 3A). A resist 5 is coated onto the blank and then patterned (FIG. 3B), after which chlorine dry etching is performed to pattern the etching mask film 4 (FIG. 3C). With the resist 5 and etching mask film 4 serving as a mask, fluorine dry etching is then performed on the antireflective film 3 and light-shielding film 2, for thereby patterning these films (FIG. 3D). The resist 5 is then stripped (FIG. 3E). Finally, the etching mask film 4 is removed by chlorine dry etching, completing a photomask wherein the antireflective film 3 is exposed on the photomask surface (FIG. 3F).

(2) The Photomask Manufacturing Process Wherein the Etching Mask Film is not Removed (Binary Mask)

Figure 4A:
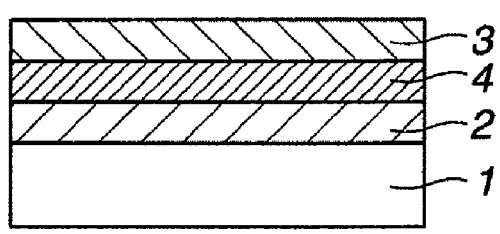
FIG. 4 schematically illustrates steps of a method for preparing a photomask according to the invention, the method using the photomask blank of the second embodiment and producing a binary mask with the etching mask film being left.
Figure 4B:
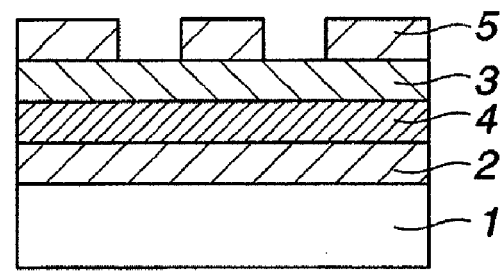
Figure 4C:
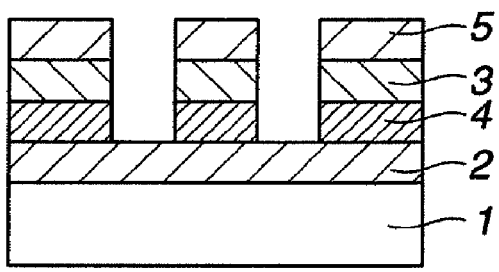
Figure 4D:
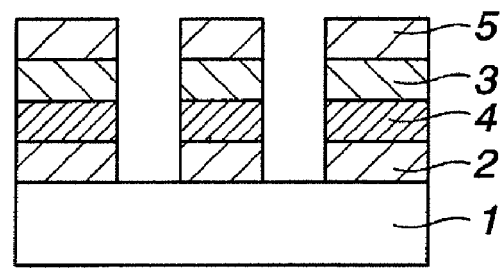
Figure 4E:
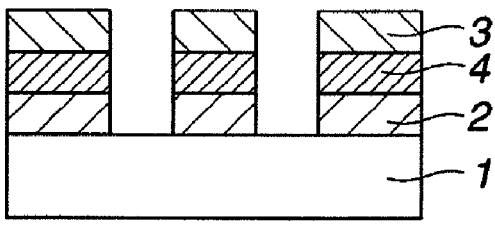

The process starts with a photomask blank comprising a light-shielding film 2, an etching mask film 4, and an antireflective film 3 deposited in sequence on a transparent substrate 1 according to the second embodiment (FIG. 4A). A resist 5 is coated onto the blank and then patterned (FIG. 4B), after which chlorine dry etching is performed to pattern the antireflective film 3 and etching mask film 4 (FIG. 4C). Next fluorine dry etching is performed on the light-shielding film 2 while the resist 5, antireflective film 3 and etching mask film 4 serve as a mask (FIG. 4D). Finally, the resist 5 is stripped, completing a photomask (FIG. 4E).

(3) The Photomask Manufacturing Process Wherein the Etching Mask Film is Removed (Halftone Phase Shift Mask)

Figure 5A:
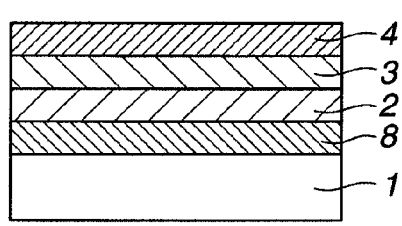
FIG. 5 schematically illustrates steps of a method for preparing a photomask according to the invention, the method using the photomask blank of the first embodiment and producing a halftone phase shift mask with the etching mask film being removed.
Figure 5B:
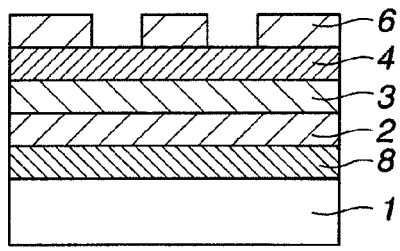
Figure 5C:
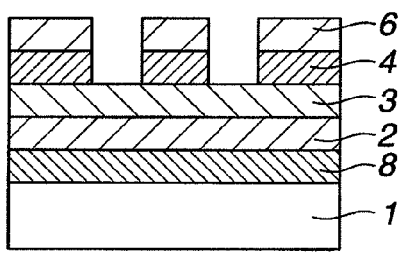
Figure 5D:
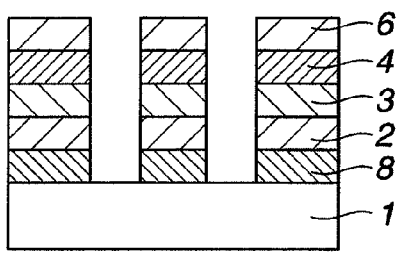
Figure 5E:
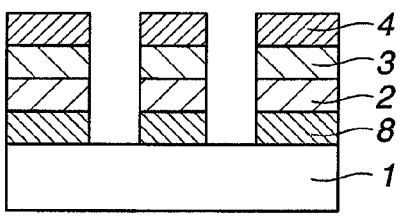
Figure 5F:
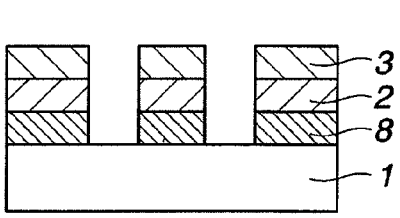
Figure 5G:
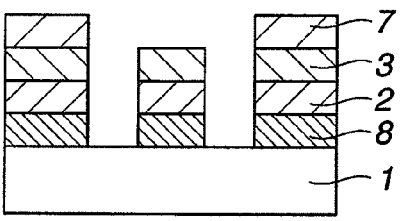
Figure 5H:
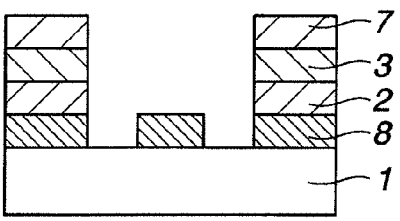
Figure 5I:
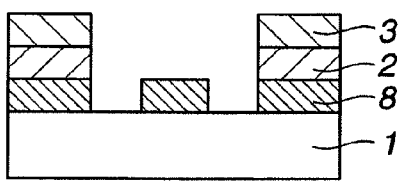

The process starts with a photomask blank comprising a halftone phase shift film 8, a light-shielding film 2, an antireflective film 3, and an etching mask film 4 deposited in sequence on a transparent substrate 1 according to the first embodiment (FIG. 5A). A first resist 6 is coated onto the blank and then patterned (FIG. 5B), after which chlorine dry etching is performed to pattern the etching mask film 4 (FIG. 5C). With the first resist 6 and etching mask film 4 serving as a mask, fluorine dry etching is then performed on the antireflective film 3, light-shielding film 2 and halftone phase shift film 8, for thereby patterning these films (FIG. 5D). Thereafter, the first resist 6 is stripped (FIG. 5E), and the etching mask film 4 is removed by chlorine dry etching (FIG. 5F). Next, a second resist 7 is coated and patterned such that a portion of the second resist where the light-shielding film 2 is to be left is left (FIG. 5G). With the second resist 7 serving as a mask, oxygen-free chlorine dry etching is performed to remove the antireflective film 3 and light-shielding film 2 (FIG. 5H). Finally, the second resist 7 is removed, completing a photomask (FIG. 5I).

(4) The Photomask Manufacturing Process Wherein the Etching Mask Film is Not Removed (Halftone Phase Shift Mask)

Figure 6A:
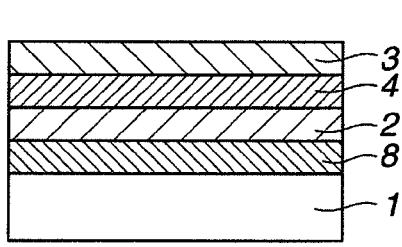
FIG. 6 schematically illustrates steps of a method for preparing a photomask according to the invention, the method using the photomask blank of the second embodiment and producing a halftone phase shift mask with the etching mask film being left.
Figure 6B:
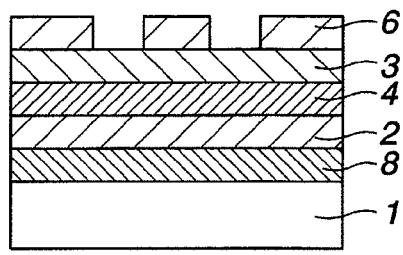
Figure 6C:
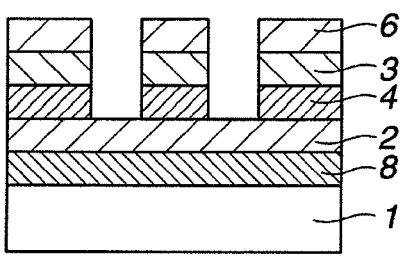
Figure 6D:
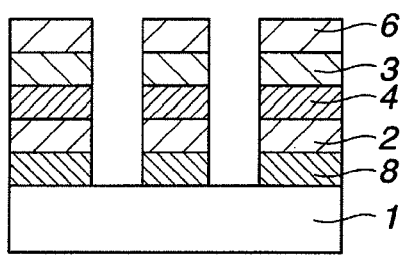
Figure 6E:
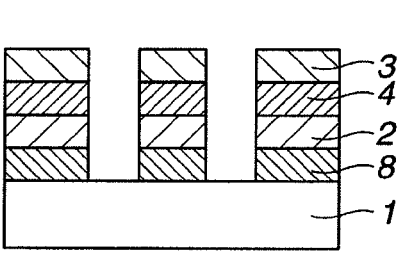
Figure 6F:
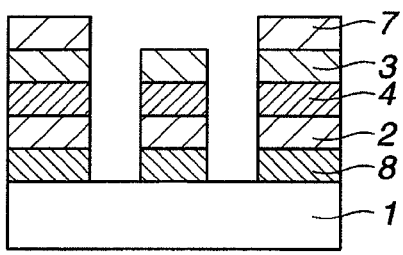
Figure 6G:
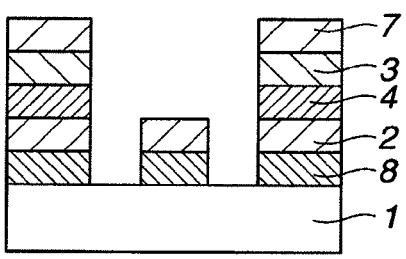
Figure 6H:
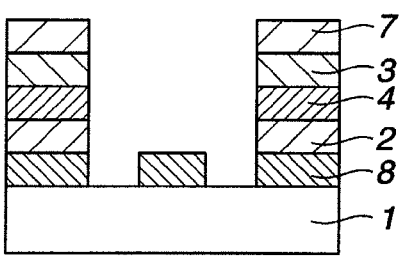
Figure 6I:
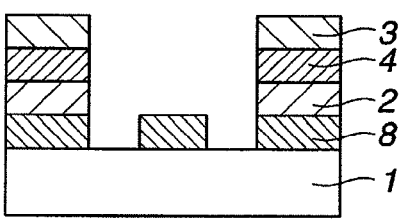
Figure 7A:
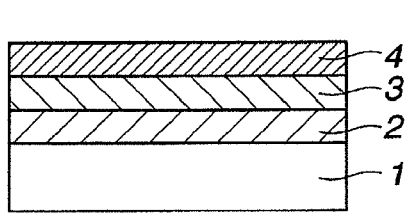
FIG. 7 schematically illustrates steps of a method for preparing a photomask according to the invention, the method using the photomask blank of the first embodiment and producing a Levenson mask with the etching mask film being removed.
Figure 7B:
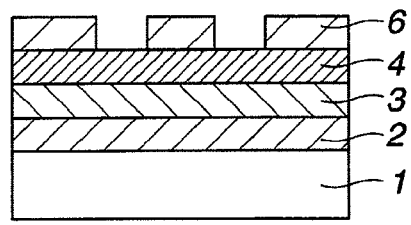
Figure 7C:
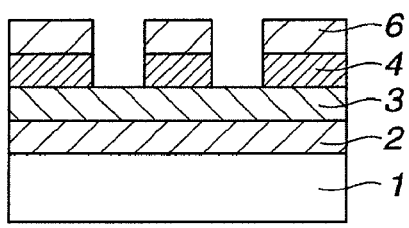
Figure 7D:
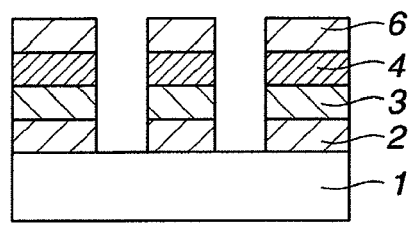
Figure 7E:
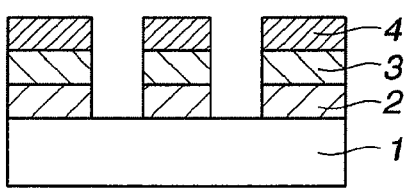
Figure 7F:
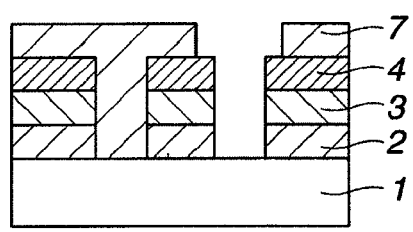
Figure 7G:
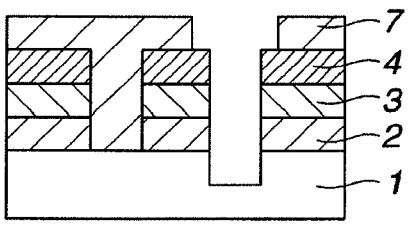
Figure 7H:
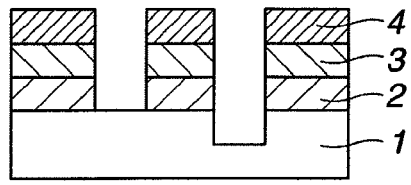
Figure 7I:
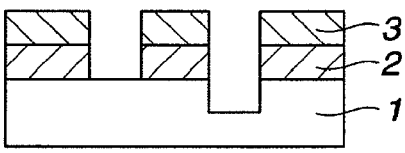
Figure 8A:
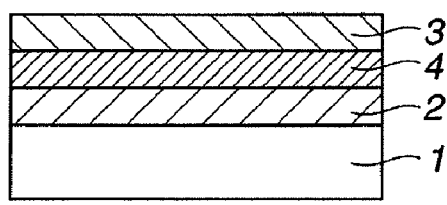
FIG. 8 schematically illustrates steps of a method for preparing a photomask according to the invention, the method using the photomask blank of the second embodiment and producing a Levenson mask with the etching mask film being left.
Figure 8B:
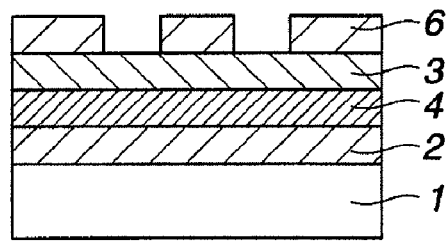
Figure 8C:
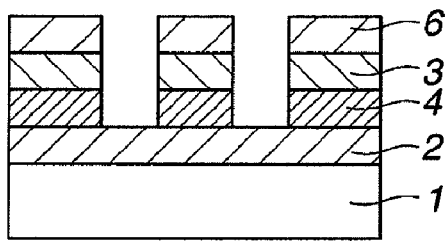
Figure 8D:
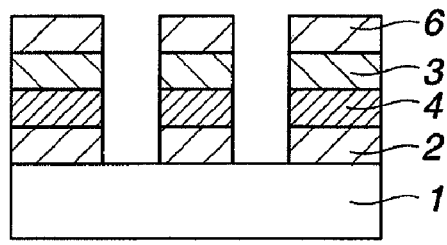
Figure 8E:
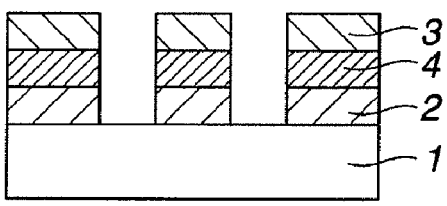
Figure 8F:
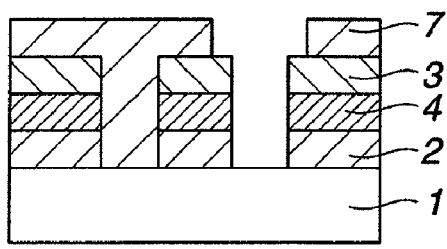
Figure 8G:
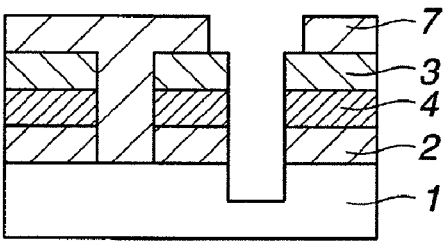
Figure 8H:
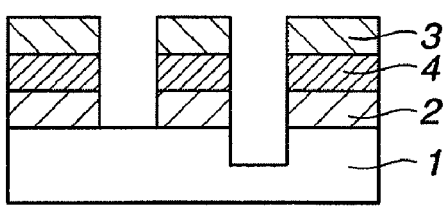

The process starts with a photomask blank comprising a halftone phase shift film 8, a light-shielding film 2, an etching mask film 4, and an antireflective film 3 deposited in sequence on a transparent substrate 1 according to the second embodiment (FIG. 6A). A first resist 6 is coated onto the blank and then patterned (FIG. 6B), after which chlorine dry etching is performed to pattern the antireflective film 3 and etching mask film 4 (FIG. 6C). With the first resist 6, antireflective film 3 and etching mask film 4 serving as a mask, fluorine dry etching is then performed on the light-shielding film 2 and halftone phase shift film 8 (FIG. 6D). Thereafter, the first resist 6 is stripped (FIG. 6E). Next, a second resist 7 is coated and patterned such that a portion of the second resist where the light-shielding film 2 is to be left is left (FIG. 6F). With the second resist 7 serving as a mask, chlorine dry etching is performed to remove the antireflective film 3 and etching mask film 4 (FIG. 6G). Next the light-shielding film 2 is removed by oxygen-free chlorine dry etching (FIG. 6H). Finally, the second resist 7 is removed, completing a photomask (FIG. 6I).

(5) The Photomask Manufacturing Process Wherein the Etching Mask Film is Removed (Levenson Mask)

The process starts with a photomask blank comprising an optional phase shift film, a light-shielding film 2, an antireflective film 3, and an etching mask film 4 deposited in sequence on a transparent substrate 1 according to the first embodiment (FIG. 7A) (the phase shift film is omitted in FIG. 7). A first resist 6 is coated onto the blank and then patterned (FIG. 7B), after which chlorine dry etching is performed to pattern the etching mask film 4 (FIG. 7C). With the first resist 6 and etching mask film 4 serving as a mask, fluorine dry etching is then performed on the antireflective film 3 and light-shielding film 2 (and phase shift film if included), for thereby patterning these films (FIG. 7D). Thereafter, the first resist 6 is stripped (FIG. 7E). Next, a second resist 7 is coated and patterned such that a portion of the second resist where the transparent substrate 1 is to be etched is removed (FIG. 7F). With the second resist 7 and etching mask film 4 serving as a mask, fluorine dry etching is performed on the transparent substrate 1 for patterning (FIG. 7G). Thereafter, the second resist 7 is removed (FIG. 7H). Finally, the etching mask film 4 is removed by chlorine dry etching, completing a photomask where the antireflective film 3 is exposed on the photomask surface (FIG. 7I).

(6) The Photomask Manufacturing Process Wherein the Etching Mask Film is not Removed (Levenson Mask)

The process starts with a photomask blank comprising an optional phase shift film, a light-shielding film 2, an etching mask film 4, and an antireflective film 3 deposited in sequence on a transparent substrate 1 according to the second embodiment (FIG. 8A) (the phase shift film is omitted in FIG. 8). A first resist 6 is coated onto the blank and then patterned (FIG. 8B), after which chlorine dry etching is performed to pattern the antireflective film 3 and etching mask film 4 (FIG. 8C). With the first resist 6, antireflective film 3 and etching mask film 4 serving as a mask, fluorine dry etching is then performed on the light-shielding film 2 (and phase shift film if included), for thereby patterning the film(s) (FIG. 8D). Thereafter, the first resist 6 is stripped (FIG. 8E). Next, a second resist 7 is coated and patterned such that a portion of the second resist where the transparent substrate 1 is to be etched is removed (FIG. 8F). With the second resist 7, antireflective film 3 and etching mask film 4 serving as a mask, fluorine dry etching is performed on the transparent substrate 1 for patterning (FIG. 8G). Finally, the second resist 7 is removed, completing a photomask (FIG. 8H).

(7) The Photomask Manufacturing Process Wherein the Etching Mask Film is Removed (Chromeless Mask).

Figure 9A:
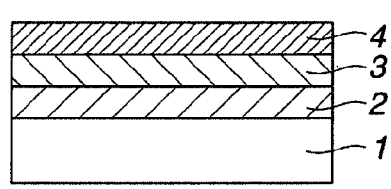
FIG. 9 schematically illustrates steps of a method for preparing a photomask according to the invention, the method using the photomask blank of the first embodiment and producing a chromeless mask with the etching mask film being removed.
Figure 9B:
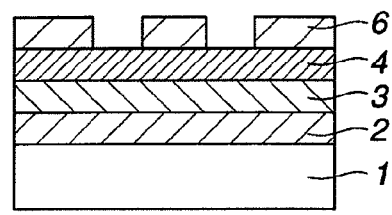
Figure 9C:
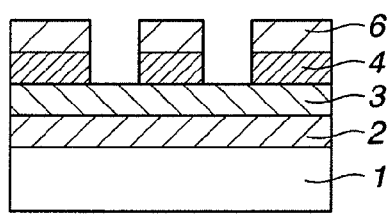
Figure 9D:
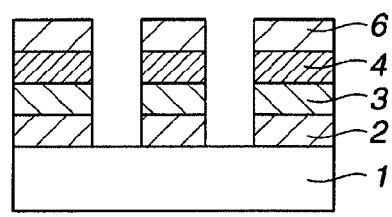
Figure 9E:
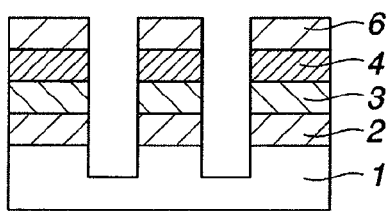
Figure 9F:
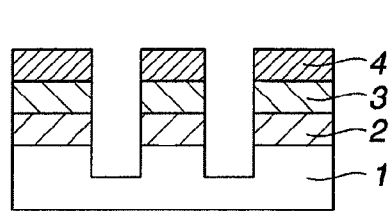
Figure 9G:
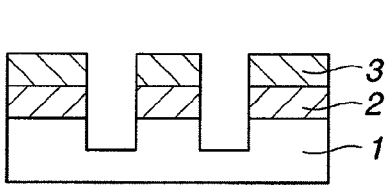
Figure 9H:
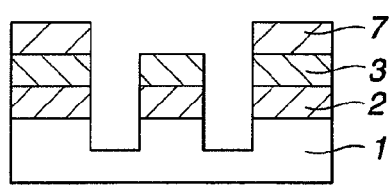
Figure 9I:
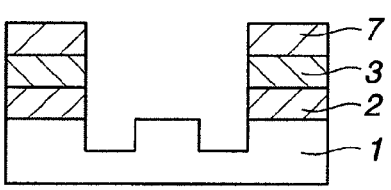
Figure 9J:
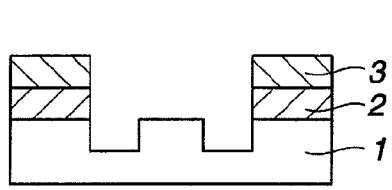

The process starts with a photomask blank comprising a light-shielding film 2, an antireflective film 3, and an etching mask film 4 deposited in sequence on a transparent substrate 1 according to the first embodiment (FIG. 9A). A first resist 6 is coated onto the blank and then patterned (FIG. 9B), after which chlorine dry etching is performed to pattern the etching mask film 4 (FIG. 9C). With the first resist 6 and etching mask film 4 serving as a mask, fluorine dry etching is then performed on the antireflective film 3 and light-shielding film 2 for patterning these films (FIG. 9D) and further continued until the transparent substrate 1 is etched (FIG. 9E). Thereafter, the first resist 6 is stripped (FIG. 9F). The etching mask film 4 is removed by chlorine dry etching (FIG. 9G). Next, a second resist 7 is coated and patterned such that a portion of the second resist where the light-shielding film 2 is to be left is left (FIG. 9H). With the second resist 7 serving as a mask, oxygen-free fluorine dry etching is performed to remove the antireflective film 3 and light-shielding film 2 (FIG. 9I). Finally, the second resist 7 is removed, completing a photomask (FIG. 9J).

(8) The Photomask Manufacturing Process Wherein the Etching Mask Film is not Removed (Chromeless Mask)

Figure 10A:
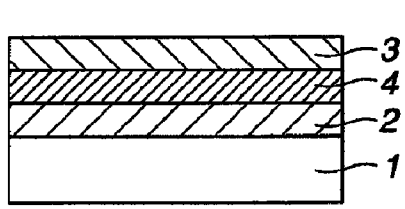
FIG. 10 schematically illustrates steps of a method for preparing a photomask according to the invention, the method using the photomask blank of the second embodiment and producing a chromeless mask with the etching mask film being left.
Figure 10B:
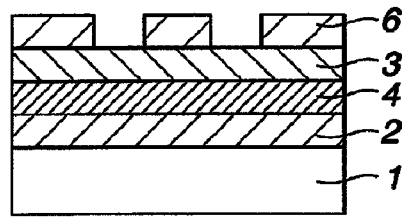
Figure 10C:
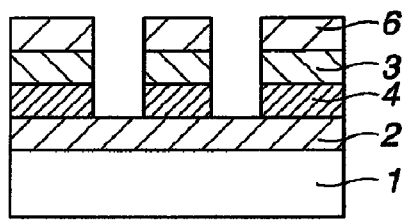
Figure 10D:
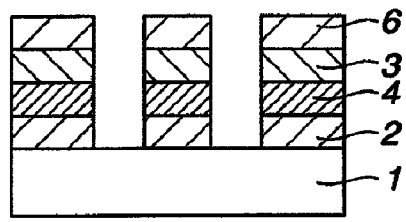
Figure 10E:
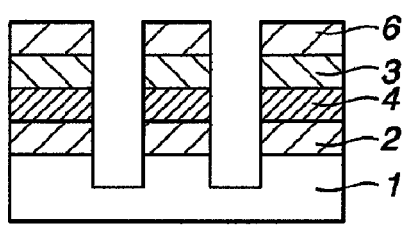
Figure 10F:
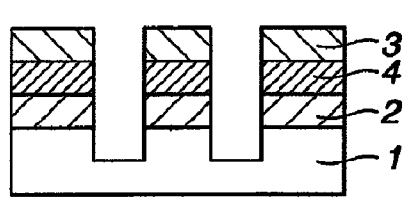
Figure 10G:
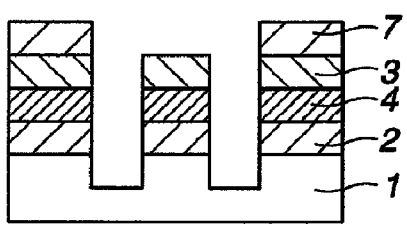
Figure 10H:
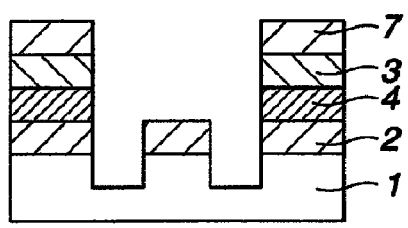
Figure 10I:
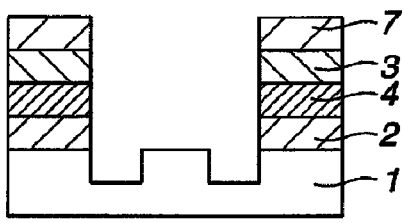
Figure 10J:
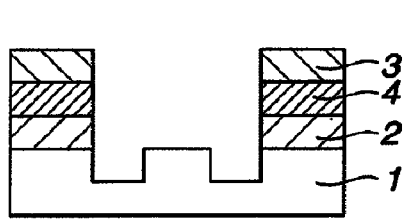

The process starts with a photomask blank comprising an optional phase shift film, a light-shielding film 2, an etching mask film 4, and an antireflective film 3 deposited in sequence on a transparent substrate 1 according to the second embodiment (FIG. 10A). A first resist 6 is coated onto the blank and then patterned (FIG. 10B), after which chlorine dry etching is performed to pattern the antireflective film 3 and etching mask film 4 (FIG. 10C). With the first resist 6, antireflective film 3 and etching mask film 4 serving as a mask, fluorine dry etching is then performed on the light-shielding film 2 for patterning the film (FIG. 10D) and further continued until the transparent substrate 1 is etched (FIG. 10E). Thereafter, the first resist 6 is stripped (FIG. 10F). Next, a second resist 7 is coated and patterned such that a portion of the second resist where the light-shielding film 2 is to be left is left (FIG. 10G). With the second resist 7 serving as a mask, chlorine dry etching is performed to remove the antireflective film 3 and etching mask film 4 (FIG. 10H). Next, the light-shielding film 2 is removed by oxygen-free chlorine dry etching (FIG. 10I). Finally, the second resist 7 is removed, completing a photomask (FIG. 10J).

EXAMPLE

Experiments and Examples are given below for further illustrating the invention although the invention is not limited thereto.

Experiment 1

As a typical photomask blank model for an ArF lithography mask, there was furnished a photomask blank comprising a CrN light-shielding film of 26 nm thick (Cr:N=9:1 in atomic ratio) and a CrON antireflective film of 20 nm thick (Cr:O:N=4:5:1 in atomic ratio) deposited in sequence on a transparent substrate. On this photomask blank, a 1:9 line-and-space pattern (isolated pattern model) and a 9:1 line-and-space pattern (isolated space model) were formed as an isolated/grouped line pattern model having a line width varying from 1.6 μm to 0.2 μm at intervals of 0.1 μm, by chlorine and oxygen dry etching under etching conditions: a $Cl_2$ flow rate of 20 sccm, an $O_2$ flow rate of 9 sccm, a He flow rate of 80 sccm, and a chamber internal pressure of 2 Pa.

As a result, in the isolated space, the size error over the range from 1.6 μm to 0.2 μm amounted to 5.3 nm in terms of the difference between minimum and maximum widths. In the isolated pattern, the width was 3.8 nm in the range from 1.6 μm to 0.5 μm, but 13.8 nm in the range from 1.6 μm to 0.2 μm. A phenomenon was observed that the etching rate substantially differs (finished thick) among fine isolated to patterns equal to or less than 0.4 μm.

Under the expectation that the line density dependency is closely correlated to etching conditions, a test was carried out on a transition metal silicide light-shielding film as the light-shielding film which can be processed under different etching conditions.

As a photomask blank model for an ArF lithography mask, there was furnished a photomask blank comprising a MoSiN light-shielding film of 23 nm thick (Mo:Si:N=1:3:1.5 in atomic ratio) and a MoSiN antireflective film of 18 nm thick (compositionally graded in a thickness direction from Mo:Si:N=1:3:1.5 in atomic ratio on the light-shielding film side to Mo:Si:N=1:5:5 in atomic ratio on the side remote from the transparent substrate) deposited in sequence on a transparent substrate. On this photomask blank, a 1:9 line-and-space pattern (isolated pattern model) and a 9:1 line-and-space pattern (isolated space model) were formed as an isolated/grouped line pattern model having a line width varying from 1.6 μm to 0.2 μm at intervals of 0.1 μm, by fluorine dry etching.

As a result, in the isolated space, the size error over the range from 1.6 μm to 0.2 μm amounted to 2.3 nm in terms of the difference between minimum and maximum widths. In the isolated pattern, the width was 9.0 nm in the range from 1.6 μm to 0.2 μm, indicating that the problem of line density dependency is significantly ameliorated.

Experiment 2

Etching Resistance Versus Chromium Content of Chromium-Based Material

Figure 11:
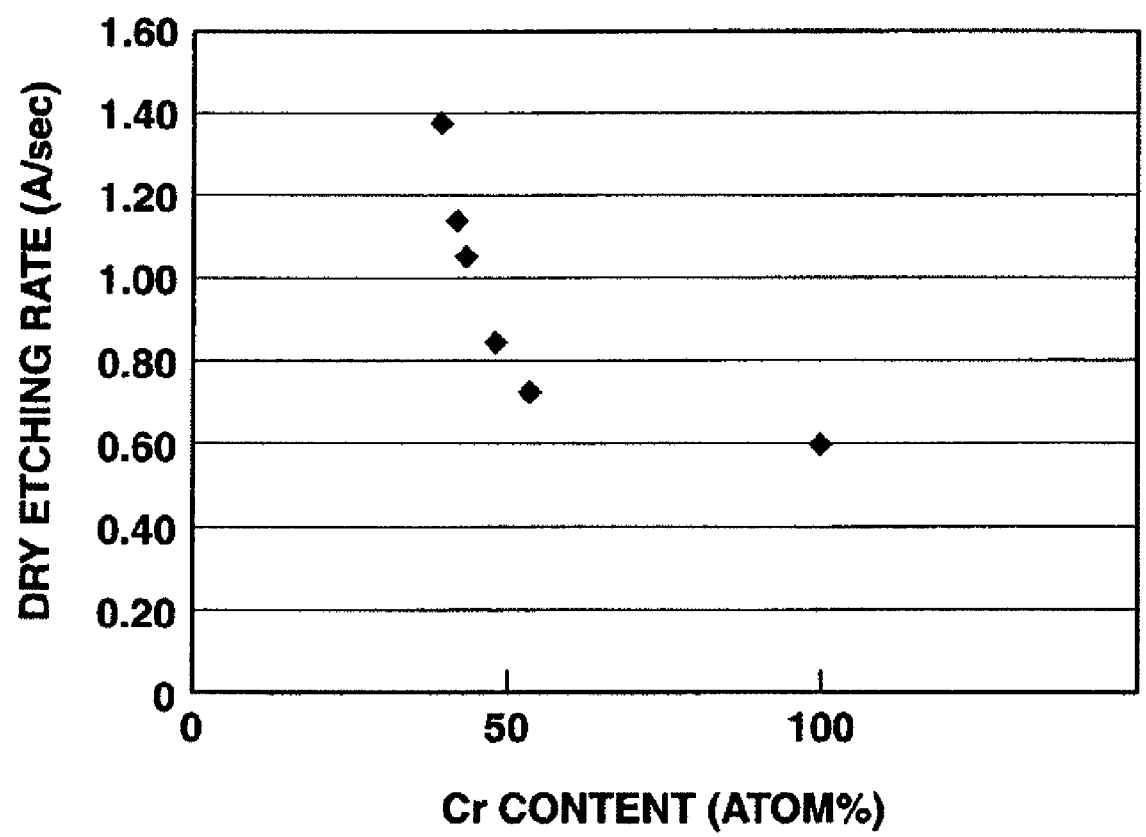
FIG. 11 is a graph showing a rate of chlorine gas dry etching versus a chromium content of a chromium-based material film as measured in Experiment 2.

To examine the etching resistance of chromium-based materials, sputtering was carried out by using metallic chromium as the target and argon, nitrogen and oxygen gases as the sputtering gas, and controlling the flow rates of nitrogen and oxygen gases. In this way, chromium-based material films having a varying ratio of chromium/oxygen/nitrogen were deposited on substrates. These chromium-based material films were dry etched with chlorine gas, determining the etching rate versus the chromium content in the film. The results are plotted in the graph of FIG. 11. It is demonstrated that the chromium-based material film exhibits good etching resistance as long as it has a chromium content equal to or more than 50 atom %.

Example 1

CrN/MoSiN/MoSiN/Substrate

A light-shielding film consisting of molybdenum, silicon and nitrogen (41 nm thick) was deposited on a quartz substrate, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, this light-shielding film had a composition Mo:Si:N=1:3:1.5 in atomic ratio.

An antireflective film of thickness-wise graded composition consisting of molybdenum, silicon and nitrogen (18 nm thick) was deposited on the light-shielding film, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, the antireflective film had a composition Mo:Si:N=1:3:1.5 in atomic ratio on the light-shielding film side and a composition Mo:Si:N=1:5:5 in atomic ratio on the side remote from the substrate (or the side where an etching mask film would be deposited).

An etching mask film of CrN (10 nm thick) was deposited on the antireflective film, using a DC sputtering system. The sputtering gas used was a mixture of argon and nitrogen and was controlledly fed to the chamber so as to provide a gas pressure of 0.05 Pa. The target used was chromium. The film was deposited while rotating the substrate at 30 rpm. On analysis by ESCA, the etching mask film had a composition Cr:N=9:1 in atomic ratio.

The above procedure yielded a photomask blank comprising a light-shielding film of MoSiN, an antireflective film of MoSiN, and an etching mask film of CrN deposited on a quartz substrate in sequence.

Next, an EB resist was coated on the etching mask film, exposed and developed whereby the resist was patterned. With the resist serving as a mask, dry etching was performed using a mixture of chlorine and oxygen as the etching gas, for patterning the etching mask film. Next, with the resist and etching mask film serving as a mask, fluorine dry etching was performed on the antireflective film and light-shielding film for patterning. Thereafter, the resist was stripped, and the etching mask film was removed by dry etching with a gas mixture of chlorine and oxygen, completing a photomask in which the etching mask film had been removed. The resulting photomask reflected faithfully the preselected feature size independent of the pattern density. This proves that the photomask blank has minimal pattern density dependency.

Example 2

CrON/CrN/MoSiN/Substrate

A light-shielding film consisting of molybdenum, silicon and nitrogen (30 nm thick) was deposited on a quartz substrate, using a DC sputtering system with two targets. The sputtering gas used was a mixture of argon and nitrogen and was controlledly fed to the chamber so as to provide a gas pressure of 0.05 Pa. The two targets used included a No target as the transition metal source and a Si (single crystal) target as the silicon source. The film was deposited while rotating the substrate at 30 rpm. On analysis by ESCA, this light-shielding film had a composition Mo:Si:N=1:3:1.5 in atomic ratio.

An etching mask film of CrN (10 nm thick) was deposited on the light-shielding film, using a DC sputtering system. The sputtering gas used was a mixture of argon and nitrogen and was controlledly fed to the chamber so as to provide a gas pressure of 0.05 Pa. The target used was chromium. The film was deposited while rotating the substrate at 30 rpm. On analysis by ESCA, the etching mask film had a composition Cr:N=9:1 in atomic ratio.

An antireflective film of CrON (20 nm thick) was deposited on the etching mask film, using a DC sputtering system. The sputtering gas used was a mixture of argon, oxygen and nitrogen and was controlledly fed to the chamber so as to provide a gas pressure of 0.05 Pa. The target used was chromium. The film was deposited while rotating the substrate at 30 rpm. On analysis by ESCA, the antireflective film had a composition Cr:O:N=4:5:1 in atomic ratio.

The above procedure yielded a photomask blank comprising a light-shielding film of MoSiN, an etching mask film of CrN and an antireflective film of CrON deposited on a quartz substrate in sequence.

Next, an EB resist was coated on the antireflective film, exposed and developed whereby the resist was patterned. With the resist serving as a mask, dry etching was performed using a mixture of chlorine and oxygen as the etching gas, for patterning the antireflective film and etching mask film. Next, with the resist, antireflective film and etching mask film serving as a mask, fluorine dry etching was performed on the light-shielding film for patterning. Thereafter, the resist was stripped, completing a photomask in which the etching mask film was left. The resulting photomask reflected faithfully the preselected feature size independent of the pattern density. This proves that the photomask blank has minimal pattern density dependency.

Example 3

CrON/MoSiN/MoSiN/Substrate

A light-shielding film consisting of molybdenum, silicon and nitrogen (41 nm thick) was deposited on a quartz substrate, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, this light-shielding film had a composition Mo:Si:N=1:3:1.5 in atomic ratio.

An antireflective film consisting of molybdenum, silicon and nitrogen (10 nm thick) was deposited on the light-shielding film, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, the antireflective film had a composition Mo:Si:N=1:4:3 in atomic ratio.

An etching mask film of CrON (10 nm thick) was deposited on the antireflective film, using a DC sputtering system. The sputtering gas used was a mixture of argon, oxygen and nitrogen and was controlledly fed to the chamber so as to provide a gas pressure of 0.05 Pa. The target used was chromium. The film was deposited while rotating the substrate at 30 rpm. On analysis by ESCA, the etching mask film had a composition Cr:O:N=4:5:1 in atomic ratio.

The above procedure yielded a photomask blank comprising a light-shielding film of MoSiN, an antireflective film of MoSiN, and an etching mask film of CrON deposited on a quartz substrate in sequence.

Next, an EB resist was coated on the etching mask film, exposed and developed whereby the resist was patterned. With the resist serving as a mask, dry etching was performed using a mixture of chlorine and oxygen as the etching gas, for patterning the etching mask film. Next, with the resist and etching mask film serving as a mask, fluorine dry etching was performed on the antireflective film and light-shielding film for patterning. Thereafter, the resist was stripped, and the etching mask film was removed, completing a photomask in which the etching mask film had been removed. The resulting photomask reflected faithfully the preselected feature size independent of the pattern density. This proves that the photomask blank has minimal pattern density dependency.

Example 4

Ta/MoSiN/MoSiN/Substrate

A light-shielding film consisting of molybdenum, silicon and nitrogen (41 nm thick) was deposited on a quartz substrate, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, this light-shielding film had a composition Mo:Si:N=1:3:1.5 in atomic ratio.

An antireflective film of thickness-wise graded composition consisting of molybdenum, silicon and nitrogen (18 nm thick) was deposited on the light-shielding film, using a DC sputtering system with two targets. The sputtering gas used was a mixture of argon and nitrogen and was controlledly fed to the chamber so as to provide a gas pressure of 0.05 Pa. The two targets used included a No target as the transition metal source and a Si (single crystal) target as the silicon source. The film was deposited while rotating the substrate at 30 rpm. On analysis by ESCA, the antireflective film had a composition Mo:Si:N=1:3:1.5 in atomic ratio on the light-shielding film side and a composition Mo:Si:N=1:5:5 in atomic ratio on the side remote from the substrate (or the side where an etching mask film would be deposited).

An etching mask film of Ta (15 nm thick) was deposited on the antireflective film, using a DC sputtering system. The sputtering gas used was argon and was controlledly fed to the chamber so as to provide a gas pressure of 0.05 Pa. The target used was tantalum. The film was deposited while rotating the substrate at 30 rpm.

The above procedure yielded a photomask blank comprising a light-shielding film of MoSiN, an antireflective film of MoSiN, and an etching mask film of Ta deposited on a quartz substrate in sequence.

Next, an EB resist was coated on the etching mask film, exposed and developed whereby the resist was patterned. With the resist serving as a mask, dry etching was performed using a mixture of chlorine and oxygen as the etching gas, for patterning the etching mask film. Next, with the resist and etching mask film serving as a mask, fluorine dry etching was performed on the antireflective film and light-shielding film for patterning. Thereafter, the resist was stripped, and the etching mask film was removed by dry etching with a gas mixture of chlorine and oxygen, completing a photomask in which the etching mask film had been removed. The resulting photomask reflected faithfully the preselected feature size independent of the pattern density. This proves that the photomask blank has minimal pattern density dependency.

Example 5

CrON/CrN/MoSiN/Substrate, Levenson Mask

As in Example 2, a photomask blank comprising a light-shielding film of MoSiN, an etching mask film of CrN, and an antireflective film of CrON deposited on a quartz substrate in sequence was manufactured.

An EB resist as a first resist was coated on the antireflective film of the photomask blank, exposed and developed whereby the first resist was patterned. With the first resist serving as a mask, dry etching was performed using a mixture of chlorine and oxygen as the etching gas, for patterning the antireflective film and etching mask film. Next, with the first resist, antireflective film and etching mask film serving as a mask, fluorine dry etching was performed on the light-shielding film for patterning. Thereafter, the first resist was stripped. An EB resist as a second resist was coated, exposed and developed, thereby forming a resist pattern in which a portion of the second resist where the quartz substrate was to be etched was removed. With the second resist, antireflective film and etching mask film serving as a mask, fluorine dry etching was performed on the quartz substrate. Thereafter, the second resist was stripped, completing a Levenson mask in which the etching mask film was left. The resulting photomask reflected faithfully the preselected feature size independent of the pattern density. This proves that the photomask blank has minimal pattern density dependency.

Example 6

(CrON/CrN)/MoSiN/MoSiN/Substrate, Levenson Mask

A light-shielding film consisting of molybdenum, silicon and nitrogen (41 nm thick) was deposited on a quartz substrate, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, this light-shielding film had a composition Mo:Si:N=1:3:1.5 in atomic ratio.

An antireflective film of thickness-wise graded composition consisting of molybdenum, silicon and nitrogen (18 nm thick) was deposited on the light-shielding film, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, the antireflective film had a composition Mo:Si:N=1:3:1.5 in atomic ratio on the light-shielding film side and a composition Mo:Si:N=1:5:5 in atomic ratio on the side remote from the substrate (or the side where an etching mask film would be deposited).

An etching mask film consisting of an inner layer of CrN and an outer layer of CrON (15 nm thick=CrN inner layer 10 nm+CrON outer layer 5 nm) was deposited on the antireflective film, using a DC sputtering system. The sputtering gas used was a mixture of argon and nitrogen during deposition of the inner layer and a mixture of argon, oxygen and nitrogen during deposition of the outer layer, and was controlledly fed to the chamber so as to provide a gas pressure of 0.05 Pa. The target used was chromium. The film was deposited while rotating the substrate at 30 rpm. On analysis of the etching mask film by ESCA, the inner layer had a composition Cr:N=9:1 in atomic ratio and the outer layer had a composition Cr:O:N=4:5:1 in atomic ratio.

The above procedure yielded a photomask blank comprising a light-shielding film of MoSiN, an antireflective film of MoSiN, and an etching mask film of two layers of CrN and CrON deposited on a quartz substrate in sequence.

An EB resist as a first resist was coated on the etching mask film of the photomask blank, exposed and developed whereby the first resist was patterned. With the first resist serving as a mask, dry etching was performed using a mixture of chlorine and oxygen as the etching gas, for patterning the etching mask film consisting of the outer layer of CrON and the inner layer of CrN. Next, with the first resist and etching mask film serving as a mask, fluorine dry etching was performed on the antireflective film and light-shielding film for patterning. Thereafter, the first resist was stripped. An EB resist as a second resist was coated, exposed and developed, thereby forming a resist pattern in which a portion of the second resist where the quartz substrate was to be etched was removed. With the second resist and etching mask film serving as a mask, fluorine dry etching was performed on the quartz substrate. Thereafter, the second resist was stripped, and the etching mask film was stripped by dry etching with chlorine gas, completing a Levenson mask in which the etching mask film had been removed. The resulting photomask reflected faithfully the preselected feature size independent of the pattern density. This proves that the photomask blank has minimal pattern density dependency.

Example 7

CrN/MoSiN/MoSi/MoSiON/Substrate, Halftone Phase Shift Mask

A halftone phase shift film consisting of molybdenum, silicon, oxygen and nitrogen (75 nm thick) was deposited on a quartz substrate, using a DC sputtering system with two targets. The sputtering gas used was a mixture of argon, oxygen and nitrogen and was controlledly fed to the chamber so as to provide a gas pressure of 0.05 Pa. The two targets used included a No target as the transition metal source and a Si (single crystal) target as the silicon source. The film was deposited while rotating the substrate at 30 rpm. On analysis by ESCA, this halftone phase shift film had a composition Mo:Si:O:N=1:4:1:4 in atomic ratio.

A light-shielding film consisting of molybdenum and silicon (23 nm thick) was deposited on the halftone phase shift film, using a DC sputtering system with two targets. The sputtering gas used was argon and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, this light-shielding film had a composition Mo:Si=1:5 in atomic ratio.

An antireflective film consisting of molybdenum, silicon and nitrogen (13 nm thick) was deposited on the light-shielding film, using a DC sputtering system with two targets. The sputtering gas used was a mixture of argon and nitrogen and was controlledly fed to the chamber so as to provide a gas pressure of 0.05 Pa. The two targets used included a Mo target as the transition metal source and a Si (single crystal) target as the silicon source. The film was deposited while rotating the substrate at 30 rpm. On analysis by ESCA, the antireflective film had a composition Mo:Si:N=1:1:2 in atomic ratio.

An etching mask film of CrN (10 nm thick) was deposited on the antireflective film, using a DC sputtering system. The sputtering gas used was a mixture of argon and nitrogen, and was controlledly fed to the chamber so as to provide a gas pressure of 0.05 Pa. The target used was chromium. The film was deposited while rotating the substrate at 30 rpm. On analysis by ESCA, the etching mask film had a composition Cr:N=9:1 in atomic ratio.

The above procedure yielded a photomask blank comprising a halftone phase shift film of MoSiON, a light-shielding film of MoSi, an antireflective film of MoSiN, and an etching mask film of CrN deposited on a quartz substrate in sequence.

A chemically amplified negative resist composition primarily comprising a hydroxystyrene resin, a crosslinker and a photoacid generator was coated on the photomask blank to a thickness of 250 nm, exposed and developed whereby the resist was patterned. With the resist serving as a mask, dry etching was performed using a mixture of chlorine and oxygen as the etching gas, for patterning the etching mask film. Next, with the resist and etching mask film serving as a mask, fluorine dry etching was performed on the antireflective film, light-shielding film and halftone phase shift film for patterning. Thereafter, the resist was stripped. The etching mask film was removed by dry etching with a gas mixture of chlorine and oxygen. To remove the unnecessary portion of the light-shielding film, a resist pattern for protecting the portion of the light-shielding film to be left was formed. Dry etching with oxygen-free chlorine gas was performed to remove the antireflective film and light-shielding film. Thereafter the resist was stripped, completing a halftone phase shift mask. The resulting photomask experienced no thinning of the pattern and reflected faithfully the preselected feature size independent of the pattern density. This proves that the photomask blank has minimal pattern density dependency.

Japanese Patent Application No. 2006-065763 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank from which is produced a photomask comprising a transparent substrate and a mask pattern formed thereon including transparent regions and effectively opaque regions to exposure light, said photomask blank comprising:
   a transparent substrate;
   a light-shielding film having a single layer structure or a multilayer structure, said light-shielding film disposed on the substrate, optionally with another film intervening therebetween, said light-shielding film consisting essentially of a metal or metal compound susceptible to fluorine dry etching, and said metal and metal compound being selected from the group consisting of silicon alone, a silicon compound comprising silicon and at least one element selected from the group consisting of oxygen, nitrogen and carbon, and a material comprising a transition metal and silicon;
   an etching mask film contiguously laminated on said light-shielding film, said etching mask film consisting essentially of a metal or metal compound resistant to fluorine dry etching, and said metal or metal compound being selected from the group consisting of chromium alone, a chromium compound comprising chromium and at least one element selected from the group consisting of oxygen, nitrogen and carbon, and free of silicon, tantalum alone, and a tantalum compound comprising tantalum and free of silicon; and
   an antireflective film contiguously laminated on said etching mask film, said antireflective film consisting essentially of a metal or metal compound selected from the group consisting of chromium alone, and a chromium compound comprising chromium and at least one element selected from the group consisting of oxygen, nitrogen and carbon, and free of silicon, wherein
   said transition metal is at least one element selected from the group consisting of titanium, vanadium, cobalt, nickel, zirconium, niobium, molybdenum, hafnium, tantalum and tungsten.

2. The photomask blank of claim 1, wherein said antireflective film and said etching mask film being composed of different elements or composed of the same elements in a different compositional ratio.

3. The photomask blank of claim 1, wherein said light-shielding film has a selectivity ratio in fluorine dry etching of at least 2 relative to said etching mask film.

4. The photomask blank of claim 1, wherein said transparent substrate has a selectivity ratio in fluorine dry etching of at least 10 relative to said etching mask film.

5. The photomask blank of claim 1, wherein said etching mask film is composed of chromium alone or a chromium compound comprising chromium and at least one element selected from oxygen, nitrogen and carbon.

6. The photomask blank of claim 5, wherein said chromium compound contains at least 50 atom % of chromium.

7. The photomask blank of claim 1, wherein said etching mask film is composed of tantalum alone or a tantalum compound comprising tantalum and free of silicon.

8. The photomask blank of claim 1, wherein said light-shielding film is composed of silicon alone or a silicon compound comprising silicon and at least one element selected from oxygen, nitrogen and carbon.

9. The photomask blank of claim 1, wherein said light-shielding film is composed of an alloy of a transition metal with silicon or a transition metal silicon compound comprising a transition metal, silicon, and at least one element selected from oxygen, nitrogen and carbon.

10. A photomask blank of claim 2, wherein
said etching mask film comprises chromium with a chromium content of at least 50 atom %, and
said antireflective film comprises chromium and oxygen with a chromium content of less than 50 atom %.

11. The photomask blank of claim 9, wherein said transition metal is molybdenum.

12. The photomask blank of claim 9, wherein said light-shielding film further comprises nitrogen with a nitrogen content of 5 atom % to 40 atom %.

13. The photomask blank of claim 1, wherein said etching mask film has a thickness of 2 to 30 nm.

14. The photomask blank of claim 1, wherein a phase shift film intervenes as said another film between the transparent substrate and the light-shielding film.

15. The photomask blank of claim 14, wherein said phase shift film is a halftone phase shift film.

16. A method for preparing a photomask, comprising patterning the photomask blank of claim 1.

17. The method of claim 16, comprising fluorine dry etching said light-shielding film through said etching mask film as an etching mask.

18. The method of claim 16, comprising fluorine dry etching said transparent substrate through said etching mask film as an etching mask.

19. The method of claim 16, wherein said photomask is a Levenson mask.

* * * * *